United States Patent
Manohar et al.

(10) Patent No.: US 9,531,194 B2
(45) Date of Patent: Dec. 27, 2016

(54) SYSTEMS AND METHODS FOR ZERO-DELAY WAKEUP FOR POWER GATED ASYNCHRONOUS PIPELINES

(75) Inventors: Rajit Manohar, Ithaca, NY (US); Carlos Otero, Ithaca, NY (US); Jonathan Tse, Ithaca, NY (US)

(73) Assignee: Cornell University, Ithaca, NY (US)

( * ) Notice: Subject to any disclaimer, the term of this patent is extended or adjusted under 35 U.S.C. 154(b) by 864 days.

(21) Appl. No.: 13/695,358

(22) PCT Filed: Apr. 29, 2011

(86) PCT No.: PCT/US2011/034549
§ 371 (c)(1),
(2), (4) Date: Dec. 18, 2012

(87) PCT Pub. No.: WO2011/137339
PCT Pub. Date: Nov. 3, 2011

(65) Prior Publication Data
US 2013/0099570 A1    Apr. 25, 2013

Related U.S. Application Data

(60) Provisional application No. 61/329,942, filed on Apr. 30, 2010.

(51) Int. Cl.
*G06F 1/32* (2006.01)
*H02J 4/00* (2006.01)
*H03K 17/20* (2006.01)

(52) U.S. Cl.
CPC ............... *H02J 4/00* (2013.01); *H03K 17/20* (2013.01); *Y10T 307/461* (2015.04)

(58) Field of Classification Search
CPC .................................................... G06F 1/3287
See application file for complete search history.

(56) References Cited

U.S. PATENT DOCUMENTS 5,124,977 A * 6/1992 Kozaki et al. ............... 370/392
7,256,608 B2   8/2007 Ranganathan et al.
(Continued)

FOREIGN PATENT DOCUMENTS

WO    2009086462 A2    7/2009

OTHER PUBLICATIONS

International Search Report dated Dec. 16, 2011 for International Application No. PCT/US11/34549.
(Continued)

*Primary Examiner* — Kim Huynh
*Assistant Examiner* — Eric Chang
(74) *Attorney, Agent, or Firm* — Burns & Levinson LLP; Orlando Lopez

(57) ABSTRACT

A device including a pipeline having a number of groups of pipeline stages. Each group has at least one pipeline stage, a gated power supply power net or a gated ground power net, the gated power supply power net and the gated ground power net having components that allow gating power supply and ground to that group of pipeline stages. The device also has a number of control components, each control component controlling the gating of power supply or ground. Each group of pipeline stages controls the gating of power supply and ground of a subsequent group of pipeline stages. Each one group of pipeline stages being selected such that a forward propagation delay from a preceding group of pipeline stages to that one group is at least equal to a time required for activating gated power supply or ground in that one group. Methods of implementation are also discussed.

41 Claims, 18 Drawing Sheets

(56) References Cited

U.S. PATENT DOCUMENTS

| | | | |
|---|---|---|---|
| 7,266,707 | B2 | 9/2007 | Ngo et al. |
| 7,545,196 | B1* | 6/2009 | Hutton et al. ............... 327/291 |
| 2004/0194037 | A1 | 9/2004 | Chen et al. |
| 2005/0251699 | A1 | 11/2005 | Jacobson |
| 2006/0059376 | A1 | 3/2006 | Ngo et al. |
| 2007/0139421 | A1* | 6/2007 | Chen et al. ................. 345/501 |
| 2008/0204124 | A1* | 8/2008 | Chakraborty et al. ........ 327/544 |
| 2009/0172452 | A1 | 7/2009 | Kong et al. |
| 2009/0217068 | A1 | 8/2009 | Fernsler, Jr. et al. |
| 2009/0292907 | A1* | 11/2009 | Schwinn et al. ............. 712/229 |

OTHER PUBLICATIONS

Written Opinion dated Dec. 16, 2011 for International Application No. PCT/US11/34549.

Roy, K. et al. Leakage Current Mechanisms and Leakage Reduction Techniques in Deep-Submicrometer CMOS Circuits. Proc. IEEE 91(2), Feb. 2003, 305-327.

Kim, S. et al. Understanding and Minimizing Ground Bounce During Mode Transition of Power Gating Structures. Proc. ISLPED, Aug. 25-27, 2003, 22-25.

Min, K-S. et al. ZigZap Super Cut-off CMOS (ZSCCMOS) Block Activation with Self-Adaptive Voltage Level Controller: An Alternative to Clock-Gating Scheme in Leakage Dominant Era. Solid-State Circuits Conference, 2003. Digest of Technical Papers. ISSCC. 2003 IEEE International, vol. 1, 400-502.

Min, K-S. et al. Leakage-Suppressed Clock-Gating Circuit with Zigzag Super Cut-Off CMOS (ZSCCMOS) for Leakage-Dominant Sub-70-nm and Sub-1-V-VDD LSIs. IEEE Trans. VLSI Sys. 14(4), Apr. 2006, 430-435.

Martin, A. J. et al. Asynchronous Techniques for System-on-Chip Design. Proc. IEEE 94(6), Jun. 2006, 1089-1120.

Thonnart, Y. et al. Automatic Power Regulation based on an Asynchronous Activity Detection and its Application to ANOC Node Leakage Reduction. 14th IEEE International Symposium on Asynchronous Circuits and Systems, Apr. 7-10, 2008, 48-57.

Imai, M. et al. Fine-grain Leakage Power Reduction Method for m-out-of-n Encoded Circuits Using Multi-Threshold-Voltage Transistors. 15th IEEE Symposium on Asynchronous Circuits and Systems, May 17-20, 2009, 209-216.

Mohammadi, S. Designing robust asynchronous circuit components. IEEE Proc. Circuits Devices Syst. 150(3), Jun. 2003, 161-166.

Martin, A. J. The Limitations to Delay-Insensitivity in Asynchronous Circuits. Sixth MIT Conference on Advanced Research in VLSI, ed. W.J.Dally, MIT Press, 1990, 263-278.

International Preliminary Report on Patentability dated Nov. 6, 2012 for International Appl. No. PCT/US2011/034549.

* cited by examiner

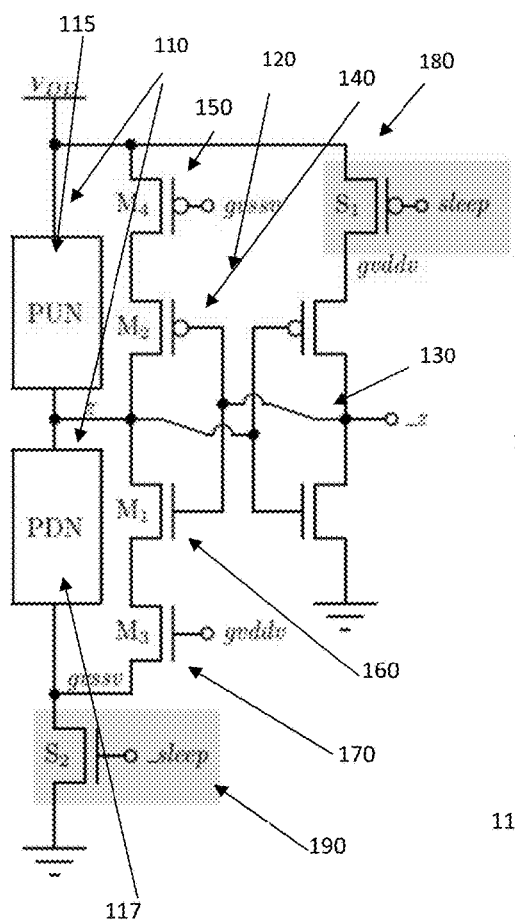
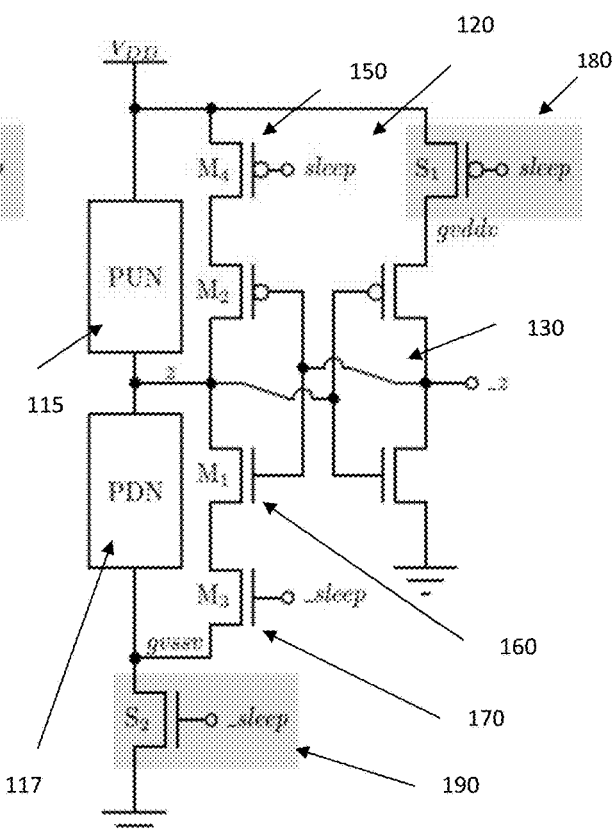
FIG. 6a
Fig. 6b

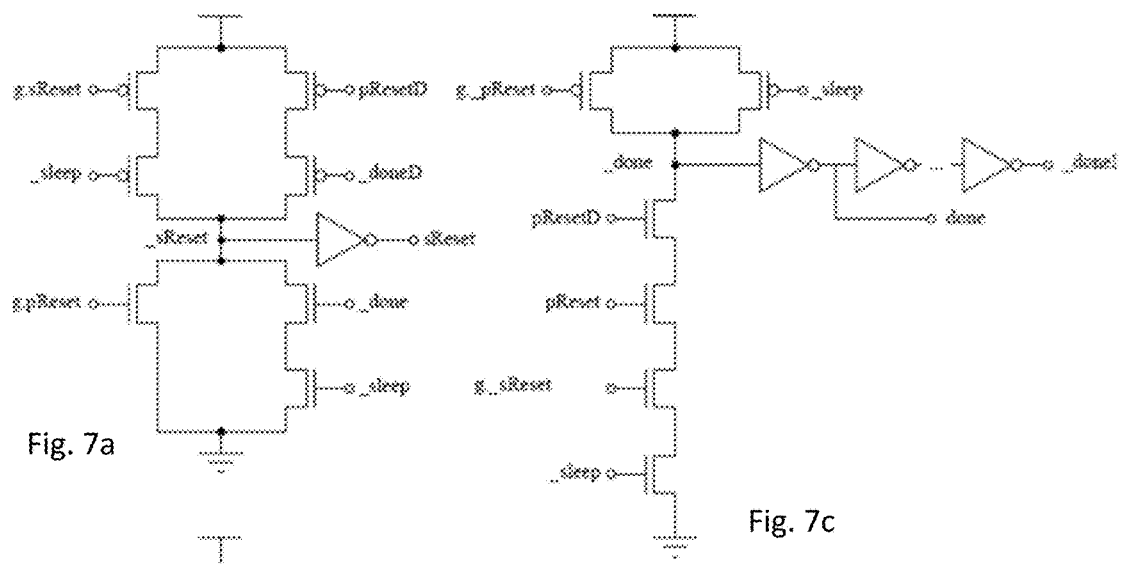
Fig. 7a
Fig. 7c
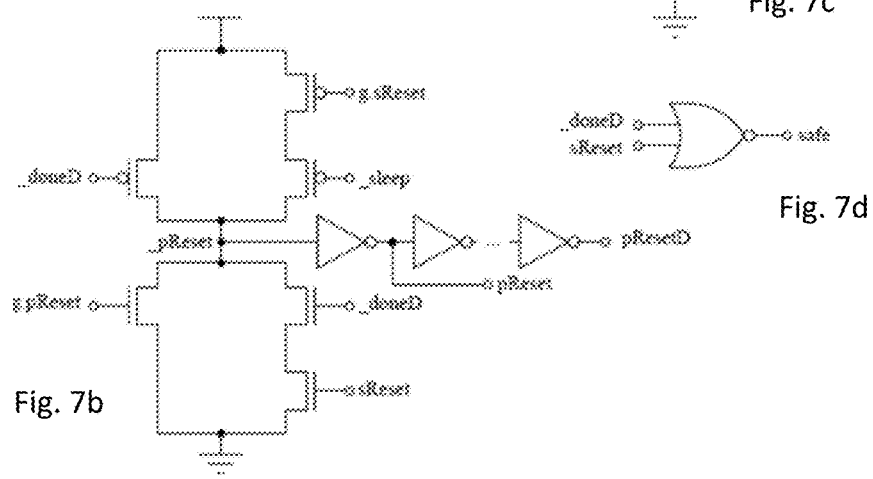
Fig. 7b
Fig. 7d

Isolation Circuitry

SYSTEMS AND METHODS FOR ZERO-DELAY WAKEUP FOR POWER GATED ASYNCHRONOUS PIPELINES

CROSS-REFERENCE TO RELATED APPLICATIONS

This application is a U.S. national stage application under 35 U.S.C. 371 of co-pending international Application No. PCT/US11/34549 filed on Apr. 29, 2011 and entitled SYSTEMS AND METHODS FOR ZERO-DELAY WAKEUP FOR POWER GATED ASYNCHRONOUS PIPELINES, which in turn claims priority to U.S. Provisional Patent Application No. 61/329,942 filed on Apr. 30, 2010, both of which are incorporated by reference herein in their entirety for all purposes.

STATEMENT REGARDING FEDERALLY SPONSORED RESEARCH OR DEVELOPMENT

This invention was made with government support under Contract No. CNS-0834582 awarded by the National Science Foundation, The government has certain rights in the invention.

BACKGROUND

These teachings relate generally to leakage current reduction, and, more particularly, to leakage current reduction in asynchronous circuits.

Reducing power consumption has become very important in recent years due to increases in transistor density and clock frequency as well as consumer trends in high-performance, portable, and embedded applications. Dynamic power losses are significant, but can be mitigated by techniques such as clock gating, which reduces the power consumption of idle sections of synchronous circuits. Asynchronous designs offer this advantage inherently, as they are data driven and are only active while performing useful work. In other words, asynchronous circuits implement the equivalent of a fine-grained clock gating network. However, while dynamic power losses have been dominant in the past, static power loss has become a major contributor to power consumption in nanoscale technologies due to leakage currents:

- Source-to-Drain ($I_{sd}$) leakage, also known as subthreshold leakage, has increased due to recent reductions in threshold voltages.
- Gate-to-Channel ($I_g$) leakage manifests as bidirectional electron tunneling between the substrate and gate through the gate oxide, which has increased due to shrinking gate oxide thickness.
- Source/Drain-to-Substrate ($I_{inv}$) leakage currents are another name for the reverse-bias currents between a transistor's active regions and bulk.

There are a wide array of techniques designed to reduce leakage currents. The most effective techniques involve power gating circuits, essentially cutting the pull-up network (PUN) and pull-down network (PDN) off from one or both power rails during idle or "sleep" periods. During active periods, the circuit is reconnected to the power rails in a process known as "wake up" or power up. While power gating has been adapted for use in asynchronous circuits most of these efforts involve direct application of synchronous techniques to asynchronous systems. As such, the unique capabilities of asynchronous circuits have not been fully leveraged in the context of power gating. Many asynchronous circuit families are robust to a wide range of supply voltages, ambient temperatures, and process variations.

There is a need for power gating techniques that utilize the unique capabilities of asynchronous circuits.

BRIEF SUMMARY

In one embodiment, the device of these teachings includes a pipeline having a number of groups of pipeline stages, each group having at least one pipeline stage, a gated power supply power net and a gated ground power net, the gated power supply power net and the gated ground power net having components that allow gating power supply and ground to that group of pipeline stages. In that embodiment, the device also has a number of control components, each control component controlling the gating of the power supply or/and ground. Each group of pipeline stages controls the gating of power supply and ground of at least one subsequent group of pipeline stages. Each one group of pipeline stages being such that a largest forward propagation delay from one or more preceding groups of pipeline stages to said one group is at least equal to a time required for activating gated power supply and ground in said one group. In one instance, each stage from each group of pipeline stages is an asynchronous stage.

In another embodiment, the device of these teachings also includes an empty pipeline detection component, receiving a control signal from a last group of pipeline stages and generating a power gating signal.

In one embodiment, the method of these teachings for gating power supply and ground in groups of pipeline stages includes dividing a pipeline into groups of pipeline stages, each group of pipeline stages having one or more pipeline stages, each group also having a gated power supply power net or/and a gated ground power net, the gated power supply power net and the gated ground power net having components that allow gating power supply and ground to the each group of pipeline stages, selecting each one group of pipeline stages such that a largest forward propagation delay from one or more preceding groups of pipeline stages to said one group is at least equal to a time required for activating gated power supply or/and ground in said one group, and controlling, for groups other than a first group, the gating of power supply or/and ground of that one group of pipeline stages by signals received from another preceding group of pipeline stages.

For a better understanding of the present teachings, together with other and further objects thereof, reference is made to the accompanying drawings and detailed description and its scope will be pointed out in the appended claims.

BRIEF DESCRIPTION OF THE DRAWINGS

FIGS. 6a, 6b are schematic block diagram representations of power gated asynchronous circuits;

FIGS. 7a-7d are schematic block diagram representations of embodiments of self reset circuits of these teachings;

DETAILED DESCRIPTION

Figure 1:
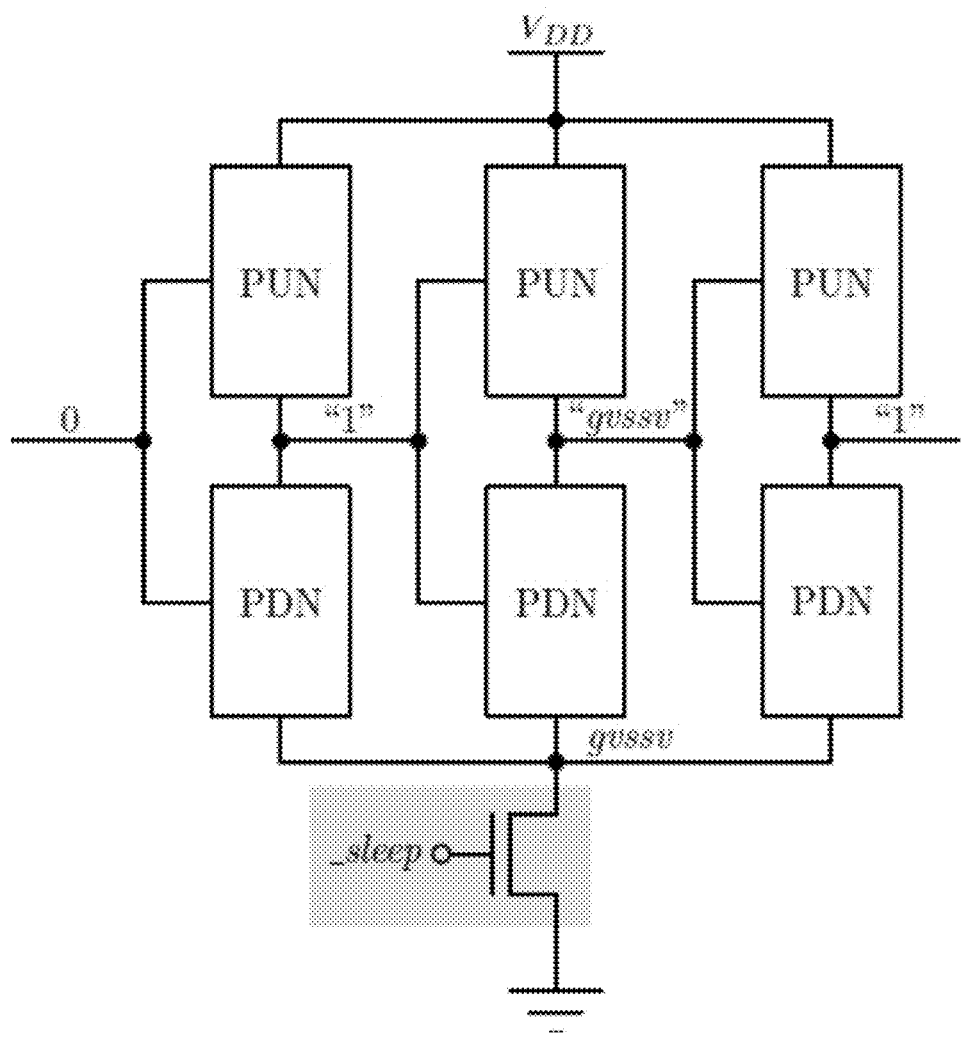
FIG. 1 is a schematic block diagram representation of a conventional powered gating arrangement.

The following detailed description is of the best currently contemplated modes of carrying out these teachings. The description is not to be taken in a limiting sense, but is made merely for the purpose of illustrating the general principles of these teachings, since the scope of these teachings is best defined by the appended claims.

A "pipeline," as used herein, is a device obtained when an process is subdivided into a sequence of subtasks, each of these subtasks been executed by a hardware stage that operates concurrently with other stages. In an asynchronous pipeline, the stages can be in parallel in the pipeline.

A "token," as used herein, is a piece of data in transit in the pipeline.

The program notation used herein as well as terms such as "probe" follow the nomenclature of the modified "guarded command language" described in A. J. Martin, "Compiling communicating processes into delay-insensitive VLSI circuits." *Distributed Computing*, 1(4):226-234, 1986, which is incorporated by reference herein in its entirety for purposes.

A "probe," as used herein, is a general Boolean operation (referred to as a "command" in A. J. Martin, *Distributed Computing*, 1(4):226-234, 1986) on channels as defined in A. J. Martin, "Compiling communicating processes into delay-insensitive VLSI circuits." *Distributed Computing*, 1(4):226-234, 1986, incorporated by reference herein in its entirety and for all purposes.

A "staticizer," as used herein, is a state-holding element.

A "staticizer," as used herein, is a latch that retains data of a dynamic logic gate.

"Activating a group of pipeline stages," as used herein, refers to initiating the process of providing voltages to the group of pipeline stages in order to bring them to an "active" state.

An "active" pipeline stage, as used herein, refers to a pipeline stage wherein the power supply and ground voltages are sufficient to initiate operation.

A "logic gate," as used herein, is a circuit having one or more Boolean inputs and one Boolean output.

A "pull-up component" of a logic gate, as used herein, is a component that causes the inputs to the logic gate to produce an output equal to "true" (or HIGH in the customarily used logic system).

A "pull down" component of a logic gate, as used herein, is a component that causes the inputs to the logic gate to produce an output equal to "false" (or LOW in the customarily used logic system).

A state-preserving gating or leakage control technique is a technique that does not lose knowledge, such as the data stored in a stage, of a state of the stage A "gated power supply power net, as used herein, is a subsystem that allow gating power supply (including one or more power supplies) to a logic gate or one or more power supplies to a pipeline stage or a group of pipeline stages.

A "gated ground power net," as used herein, is a subsystem that allows gating ground, including one or more ground voltages, to a logic gate or a pipeline stage or a group of pipeline stages.

In one embodiment, the device of these teachings includes a pipeline having one or more groups of pipeline stages, each group having at least one pipeline stage, a gated power supply power net, and in some instances, and/or a gated ground power net, the gated power supply power net and the gated ground power net having components that allow gating power supply and/or ground to the each group of pipeline stages. In that embodiment, the device also has one or more control components, each control component controlling the gating of power supply and/or ground. Each group of pipeline stages controls the gating of power supply and/or ground of at least one subsequent group of pipeline stages. Each one group of pipeline stages being such that a largest forward propagation delay from at least one preceding group of pipeline stages to said one group is at least equal to a time required for activating gated power supply and ground in said one group. In one instance, each stage from each group of pipeline stages is an asynchronous stage.

In one instance, in the above embodiment, gated (virtual) power supply voltage is substantially equal to an ungated power supply voltage and gated (virtual) ground voltage is substantially equal to ungated ground voltage. In another instance, in the above embodiment, gated (virtual) power supply voltage is less than an ungated power supply voltage and gated (virtual) ground voltage is greater than ungated ground voltage.

In one embodiment, the control components receive a command to power down gated power supply power nets.

In another embodiment, the device of these teachings also includes an empty pipeline detection component. In one instance, the empty pipeline detection component receives a control signal from a last group of pipeline stages and generates a power gating signal. In one instance, the empty pipeline detection component includes a pair of rotary counters. In that instance, a first rotary counter from the pair counts tokens coming into the pipeline and a second rotary counter from the pair counts tokens exiting the pipeline.

In another instance, the empty pipeline detection component includes a controller receiving a decrement signal when a token exits from the exit group or groups of pipeline stages and an increment signal when a token enters a first group of pipeline stages, and a counter receiving signals from said controller, the signals being increment signals and decrement signals. The counter produces a zero value representing an empty state of the pipeline. The controller ensures that the counter does not receive one increment/decrement signal while one decrement/increment signal is being processed and ensures that substantially simultaneous increment and decrement signals are acknowledged but not counted.

In yet another instance, the empty pipeline detection component includes a controller receiving a decrement signal when a token exits from the exit group or groups of pipeline stages and an increment signal when a token enters a first group of pipeline stages, and a pair of counters. A first counter from the pair receives signals for odd numbered tokens and a second counter from the pair receives signals for even numbered tokens, the signals being increment signals and decrement signals. Each one of the first and second counters producing a zero value when a count of the decrement signals equals a count of increment signals. A value representing an empty state of the pipeline be obtained from a logical AND operation receiving as input the zero value from the first counter and the zero value from the second counter. The controller ensures that the counter does not receive one increment/decrement signal while one decrement/increment signal is being processed and ensures that substantially simultaneous increment and decrement signals are acknowledged but not counted.

In a further instance, a group of pipeline stages includes memory components. In that instance, the gated power supply power net and the gated ground power net are state preserving power nets. (State preserving gating is disclosed herein below.)

In one embodiment, the method of these teachings for gating power supply and ground in groups of pipeline stages includes dividing a pipeline into groups of pipeline stages, each group of pipeline stages having one or more pipeline stages, each group also having a gated power supply power net, and in one instance, and/or a gated ground power net, the gated power supply power net and the gated ground power net having components that allow gating power supply and ground to the each group of pipeline stages, selecting each one group of pipeline stages such that a largest forward propagation delay from one or more preceding groups of pipeline stages to said one group is at least equal to a time required for activating gated power supply, and in one instance, and/or ground in said one group, and controlling, for groups other than a first group, the gating of power supply, and in one instance, and/or ground of that one group of pipeline stages by signals received from another preceding group of pipeline stages.

In one embodiment of the method of these teachings, each stage from each group of pipeline stages is an asynchronous stage.

In one instance, the step of selecting each one group includes selecting the time required for activating gated power supply and ground in that one group such that gated (virtual) power supply voltage is substantially equal to an ungated power supply voltage and wherein gated (virtual) ground voltage is substantially equal to ungated ground voltage.

In another instance, the step of selecting each one group includes selecting the time required for activating gated power supply and ground in that one group such that gated (virtual) power supply voltage is less than an ungated power supply voltage and wherein gated (virtual) ground voltage is greater than an ungated ground voltage.

In another embodiment of the method of these teachings, the method also includes determining whether the pipeline is empty, and providing, if the pipeline was determined to be empty, a signal controlling the activation of gated power supply and ground.

In one instance, the step of determining whether the pipeline is empty includes receiving, at a controller, an increment signal for tokens coming into a first stage of the pipeline, receiving, at a controller, a decrement signal for tokens exiting an exit stage or stages of the pipeline, providing, from the controller to a counter, the increment signals and the decrement signals and obtaining, from the counter, a zero value when a count indicates an empty state of the pipeline.

In another instance, the step of determining whether the pipeline is empty also includes ensuring that the counter does not receive one increment/decrement signal while one decrement/increment signal is being processed and ensuring that substantially simultaneous increment and decrement signals are acknowledged but not counted.

In yet another instance, the step of determining whether the pipeline is empty includes receiving, at a controller, an increment signal for tokens coming into a first stage of the pipeline, receiving, at a controller, a decrement signal for tokens exiting a last stage of the pipeline, providing, from the controller to a first counter, received signals corresponding to odd numbered tokens, providing, from the controller to a second counter, received signals corresponding to even numbered tokens, each one of the first and second counters producing a zero value when a count of the decrement signals equals a count of increment signals, and obtaining a value representing an empty state of the pipeline from a logical AND operation receiving as input the zero value from the first counter and the zero value from the second counter.

The following description of power gating in circuits is presented in order to facilitate the understanding of these teachings.

Power gating techniques essentially increase the effective resistance of leakage paths by adding sleep transistors between transistor stacks and power supply rails. Oftentimes, these power gating or sleep transistors are shared amongst multiple logic stacks to reduce the number of leakage paths as well as area overheads. Sharing the transistors effectively creates two new power nets: Gated Power Supply, also referred to as Gated-Vdd, (gvddv) and Gated-Ground (gvssv), which replace VDD and GND for power-gated logic stacks. gvddv (also referred to as the gated or virtual power supply voltage) is connected to VDD using a head sleep transistor and gvssv (also referred to as the gated or virtual ground voltage) is connected to GND using a foot sleep transistor.

FIG. 1 illustrates Cut-Off (CO) power gating using a foot sleep transistor, which is shared by several logic blocks. The output nodes tend to drift to gvssv, which itself drifts towards VDD.

Regardless of which rail is gated, the power gating or sleep transistor(s) should be made very large to meet the current draw of the circuit in active mode. Typically, only one rail is gated due to area constraints. An nMOS foot transistor, as seen in FIG. 1, is preferred due to its greater drive strength, hence, decreased area-compared to a pMOS transistor. To reduce the leakage even further, high-Vt thick gate-oxide devices are commonly used as power gating transistors.

Non-State Preserving Power Gating

Non-state preserving techniques destroy state by allowing internal nodes to uniformly drift towards one of the power rails. This general class of power-gating techniques has various implementation methodologies:

Cut-Off (CO): Both the logic and sleep transistors are implemented using regular-Vt devices.

Multi-Threshold (MTCMOS): The logic is implemented using low-Vt transistors and the sleep transistors are implemented using high-Vt devices. This configuration allows the logic to be fast during active mode and the sleep transistors to properly cutoff source-to-drain subthreshold leakage currents during idle mode.

Boosted-Gate (BGMOS): As in MTCMOS, BGMOS uses low-Vt logic, but very high-Vt thick-oxide sleep transistors, which hurt active mode performance. To mitigate this, the gate of the sleep transistor is driven above VDD during active mode to improve current drive capability.

Super Cut-Off (SCCMOS): The gate of the sleep transistor is driven past the supply voltages-above VDD or below ground-during idle periods by using a bias voltage. However, wake up time is increased with respect to schemes which do not over-drive the gate.

With the exception of Cut-Off power gating, all of these techniques require the foundry to provide devices with different thresholds and oxide thicknesses. Most modern CMOS processes have transistors with multiple threshold voltages available. BGMOS and SCCMOS require a bias voltage generator, e.g. a switched capacitor circuit, which increases the strain on the gate of the sleep transistor, and may introduce some undesirable parasitic effects such as latchup. To mitigate the increased strain on the gate of the sleep transistor, it is desirable to have thick-oxide devices. However, the power consumed by the bias generation circuitry could offset the power savings from power gating, especially in ultra-low power systems or systems where the number of power-gated transistors is small.

The primary disadvantage of these techniques is that the state of internal nodes is lost. For example, in FIG. 1, the inputs to the first stage while idle are logic 0, and the output of the first stage is logic 1. However, if we assume that the gate ($I_g$) and the source-to-drain ($I_{sd}$) leakage currents are greater than the reverse-bias source/drain-to-substrate ($I_{inv}$) leakage current, i.e. $I_g + I_d > I_{inv}$, the output of the second logic stage drifts to gvssv. In fact, over a long time period all CO power gated output nodes will drift to gvssv, as discussed herein below.

State Preserving Power Gating

State preserving power gating techniques reduce leakage while retaining state. The tradeoff between these techniques and non-state preserving techniques is that they are not as effective at reducing leakage currents.

One technique, Variable Threshold (VTCMOS), varies transistor threshold voltages by biasing the substrate. By enforcing lower threshold voltages in active mode versus idle mode, this method retains performance while active and reduces leakage while idle. However, as with SCCMOS, the VTCMOS scheme requires a bias voltage generator, as well as the use of triple well processes. VTCMOS does have the advantage of not requiring additional transistors aside from those used for control and bias generation.

If the idle state of a circuit is known at design time, and the area overhead of adding sleep transistors is acceptable, we can employ the Zig-Zag Cut-Off (ZZCO) power gating technique. As in non-state preserving techniques, ZZCO, introduces two power nets: Gated-Vdd (gvddv) and Gated-Ground (gvssv). Rather than gating every logic stage in the same fashion, the selection of head or foot transistor is governed by the desired logic level of the output node.

Figure 2:
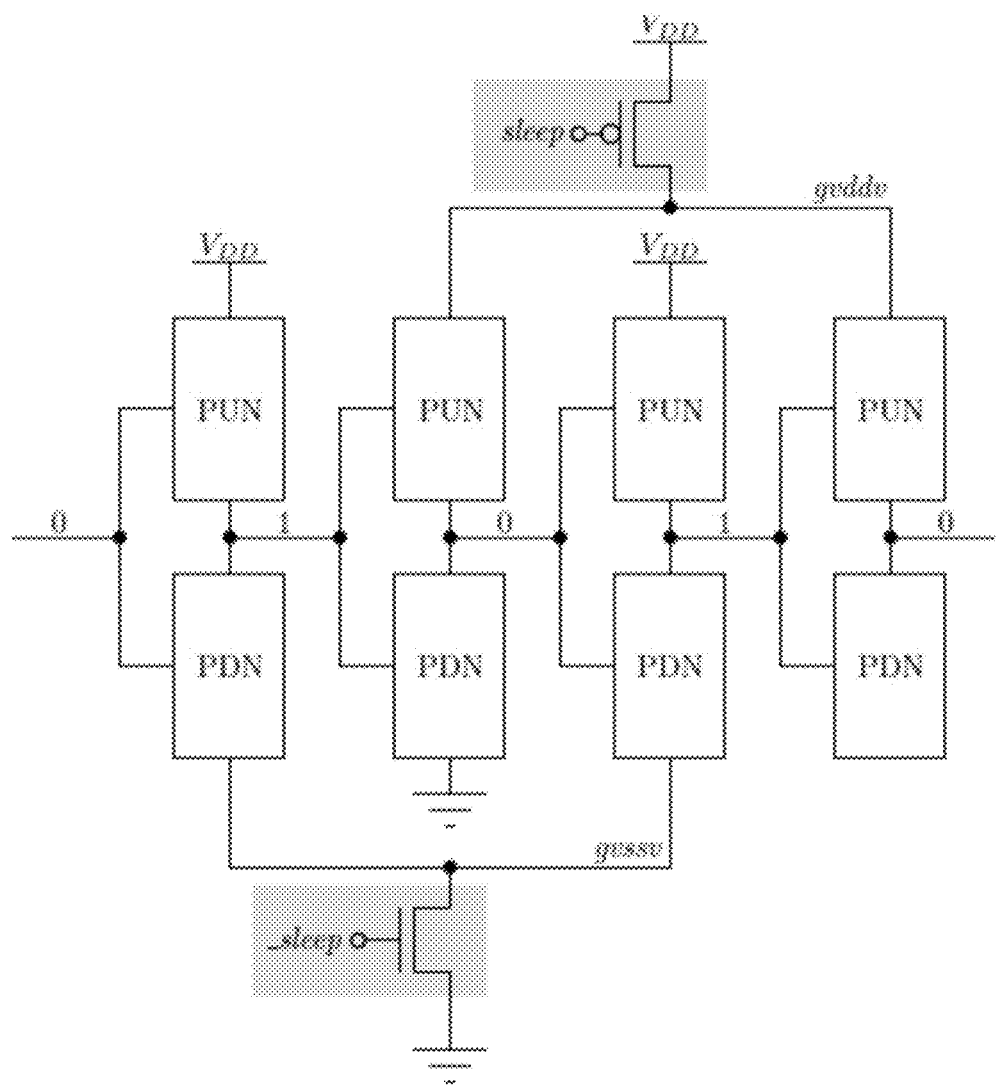
FIG. 2 is a schematic block diagram representation of another conventional powered gating arrangement.

FIG. 2 shows a Zig-Zag Cut-Off (ZZCO) configuration using a pair of sleep transistors, which are shared between several logic blocks. The configuration of sleep transistors restores the output nodes to the appropriate idle state values.

Figure 3:
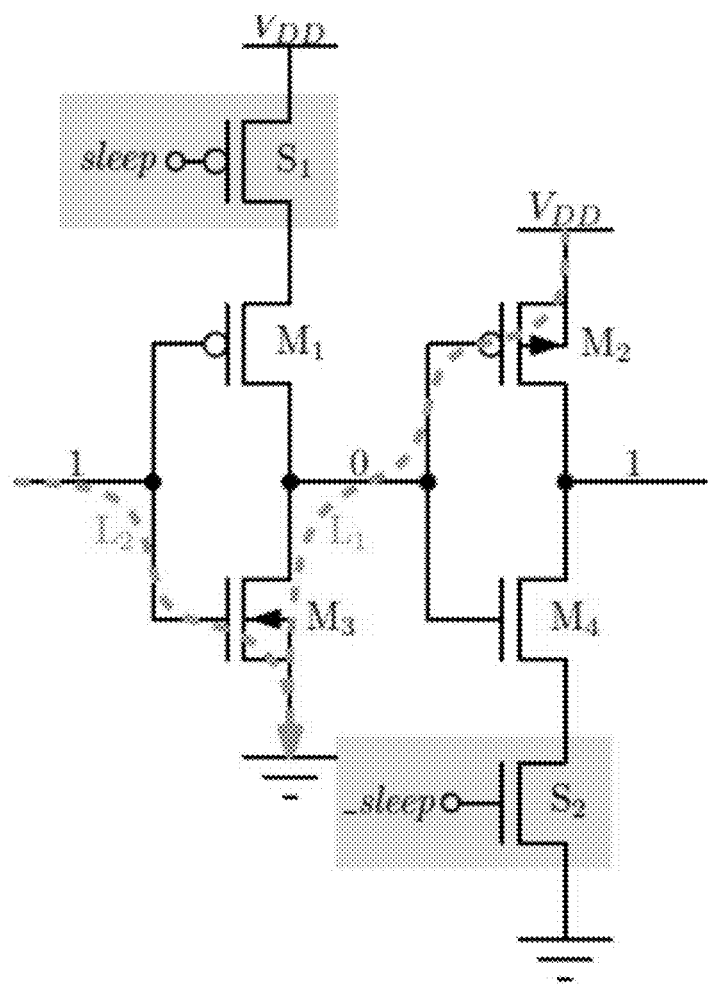
FIG. 3 is a schematic block diagram representation of yet another conventional powered gating arrangement.

FIG. 3 depicts Sneaky gate leakage paths in Zig-Zag Cut-off (ZZCO). The sleep transistors are shared between several logic blocks. For clarity, the substrate connections are shown for M2 and M3.

As shown in FIG. 2, gvddv and GND are used as power rails for logic blocks with a logic 0 output when idle and VDD and gvssv for blocks with a logic 1 output when idle. In other words, if the desired idle output is 0, cut off the stack from VDD, and vice versa for an idle output of 1. The ZZCO scheme can be combined with other techniques used in non-state holding power gating schemes as well, such as biased control signals as in ZSCCMOS and BGMOS, or devices with different thresholds as in MTCMOS.

The primary disadvantage of ZZCO is the presence of sneaky-leakage paths; not all paths from the output nodes to the power rails are disabled. The primary leakage mechanism is through the gates of neighboring stacks. Consider, for example, two inverters using ZZCO power gating as shown in FIG. 3. Even assuming that sleep transistors S1 and S2 provide perfect cutoff from the power rails, there are two essentially equivalent paths: L1, from VDD to GND through the gate of M2, and L2, from the input to GND through the gate of M3. Note that the gate-to-body voltage of the transistors ($|V_{gb}|$), specifically M2 and M3, is essentially VDD. As the gate leakage is exponentially dependent on the electric field (voltage) across the gate, i.e. $V_{gb}$, ZZCO is not particularly effective at mitigating gate leakage currents.

Asynchronous Power Gating

Pseudo-Static Logic

Figure 4A:
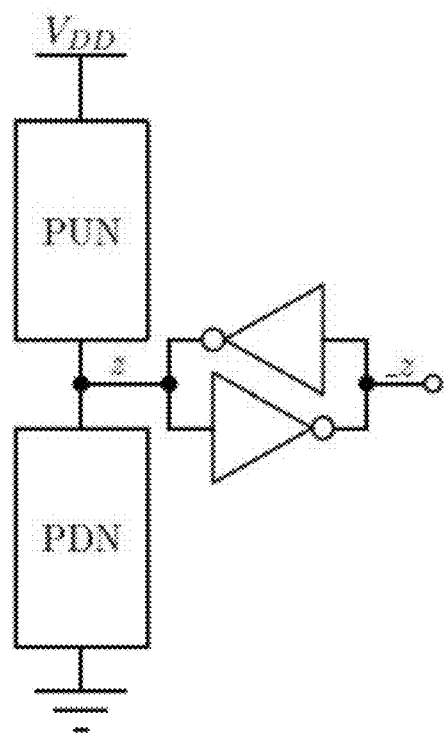
FIG. 4 is a schematic block diagram representation of a conventional powered gating arrangement for an asynchronous circuit.
Figure 4B:
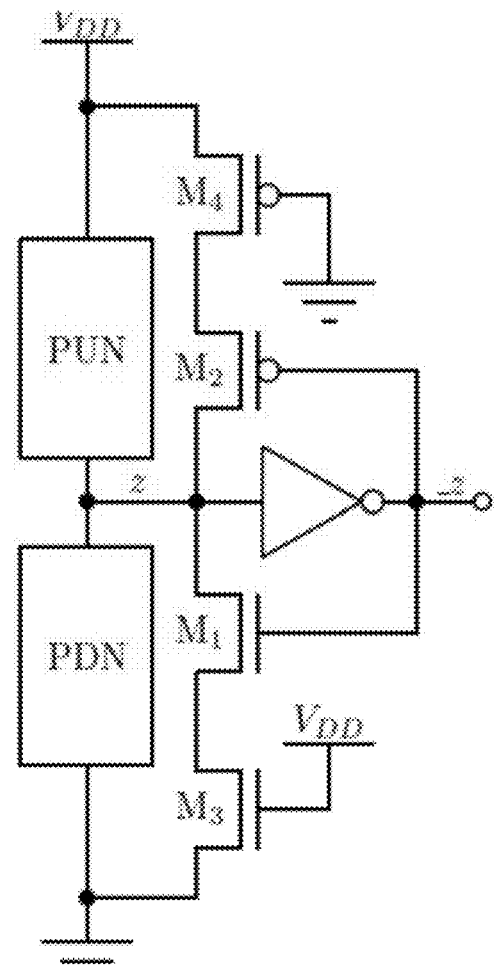

Adding a staticizer (state-holding element a.k.a. bleeder, keeper) to the output node, z, of a dynamic operator ensures the output is always driven. Such an operator is known as a pseudo-static gate. FIGS. 4a and 4b show (a) a Pseudo-Static CMOS Gate and (b) a Weak Feedback Inverter. An implementation of a generic pseudo-static operator is shown in FIG. 4a. The staticizer consists of two cross-coupled inverters attached to node z. Note that there is always opposition to any change in z due to the feedback inverter. To ensure correct operation, the transistors of the feedback inverter must be sized to be weaker than the logic stacks of the operator. Furthermore, the feedback transistors add parasitic capacitance to the output node. To mitigate this effect, each feedback transistor is split in two, as shown in FIG. 4b.

The feedback stack now consists of a minimum sized transistor closer to the output, M1(M2), and a long transistor closer to the power rails, M3(M4). In order to reduce the load on node_z, the gates of the long transistors, M3(M4), are usually connected to VDD(GND) or to Reset(_Reset).

Non-State Preserving

Any of the previously discussed non-state preserving techniques can be applied to pseudo-static logic. However, waking up a circuit without resetting all its pseudo-static elements into known, safe states could result in incorrect circuit behavior, or even the potential for stable short-circuits between power rails.

This problem is not unique to power gating—in fact, it is a concern during the initial power up of asynchronous circuits, which use pseudo-static gates. Fortunately, the addition of reset transistors to initialize the appropriate circuit nodes is a viable solution. In the case of power up, the signals which drive the gates of these reset transistors are generated off-chip. However, initial power up is a global event. As the off-chip environment is unaware of the entire internal state of the chip, generating reset signals for each individual power gated circuit off-chip would prove to be practically impossible, even just considering package pins as a limitation.

To ensure correctness and safe operation, each power gated circuit requires its own self reset circuitry. In the asynchronous design methodology of these teachings, transistors both in series and in parallel with pull-up and pull-down stacks are used. To control the parallel and series reset transistors, pReset and sReset signals and their complements are used, respectively. While the order and delay between asserting pReset and sReset is flexible, pReset must be deasserted before sReset to prevent any short circuits between power rails. A typical reset sequence is as follows:
1) Assert pReset, sReset, and their complements and hold them until all the circuit output nodes have been charged to their appropriate safe states.
2) Deassert pReset and its complement.
3) Deassert sReset and its complement.

Note that in order for the self reset circuit to be quasi-delay insensitive (QDI), it would have to instrument every output node in order to determine whether or not it has reached the appropriate safe state during step 1 above. This endeavor quickly becomes very costly in transistor count, area, complexity, and power. A similar argument applies for determining the appropriate delay between steps 2 and 3 above. As such, the self reset circuit we propose is not QDI, but instead relies on the timing assumption that a delay line, tailored to the circuit being reset, is sufficient to guarantee safe reset of all internal circuit nodes. Again, a similar argument involving a delay line between steps 2 and 3 applies.

Embodiments of Self reset circuitry of these teachings are shown in FIGS. 7a-7d. FIG. 5 depicts Self reset circuit behavior immediately after sleep goes low. FIGS. 7a-7d illustrate circuits that generate the voltage waveforms in FIG. 5, as well as providing the "safe" signal, a signal indicative of a cluster having substantially safely powered-on and which is used in the isolation circuits.

Figure 5A:
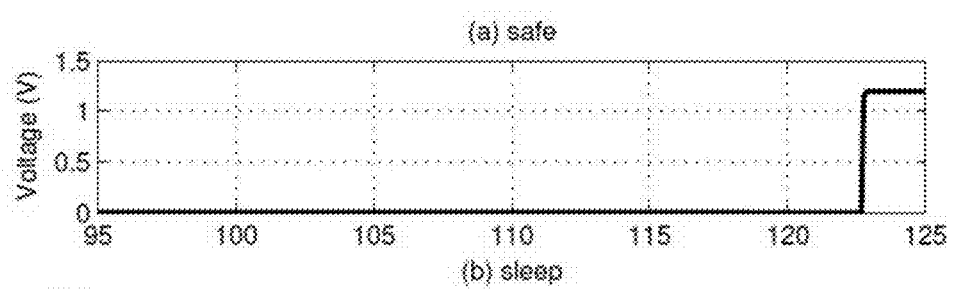
FIGS. 5a-5c are graphical schematic representations of behavior of a power gated asynchronous circuit under one condition.
Figure 5B:
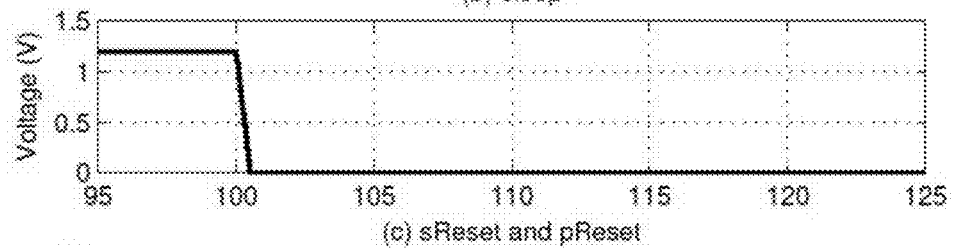
Figure 5C:
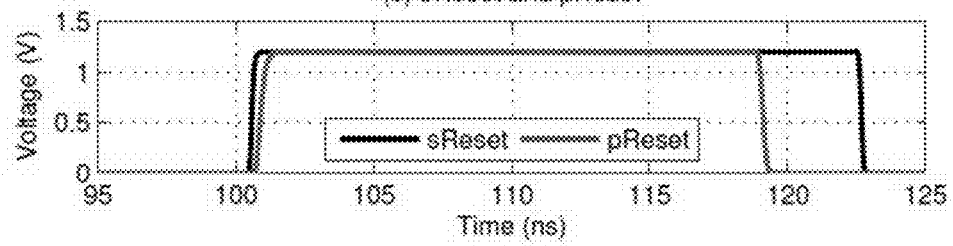

Upon deasserting the sleep signal, i.e. waking up the circuit, the self reset circuitry will assert sReset and pReset in that order, then deassert them in reverse order as seen in FIGS. 5a-5c. The timings between these transitions are controlled by delay lines. Note that pReset should be held long enough to account for the charge/discharge latency of the local supply rails—i.e. gvssv—and the worst case reset latency. Depending on process variations, it may be desirable to further increase the hold time of pReset. In fact, it is advisable to layout the delay line as close to the logic as possible in order to replicate localized systematic process variations. Once the self reset sequence is complete, a safe signal is raised, as seen in FIG. 5a.

From the time the circuit has been power gated until the circuit completes its internal self reset, the outputs of the gated circuit are undefined. If the rest of the pipeline is operating, these undefined outputs should not corrupt the rest of the system, particularly pipeline stages which have been fully woken up. This impacts both the pipeline stage inputs-through acknowledge signals—and outputs-through data signals. Isolation circuits are introduced to make sure that all output signals from the power gated block remain in a well-defined state. Adding isolation circuits to the input of a stage prevents signals from interfering with the self reset of a stage, and isolation circuits on the output prevent any glitches from propagating to other pipeline stages during the self reset stage.

Figure 8A:
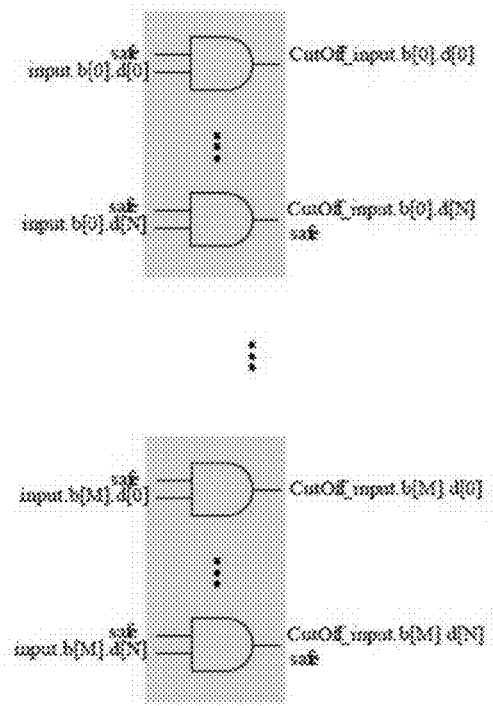
FIGS. 8a-8c are schematic block diagram representations of embodiments of isolation circuits of these teachings.
Figure 8B:
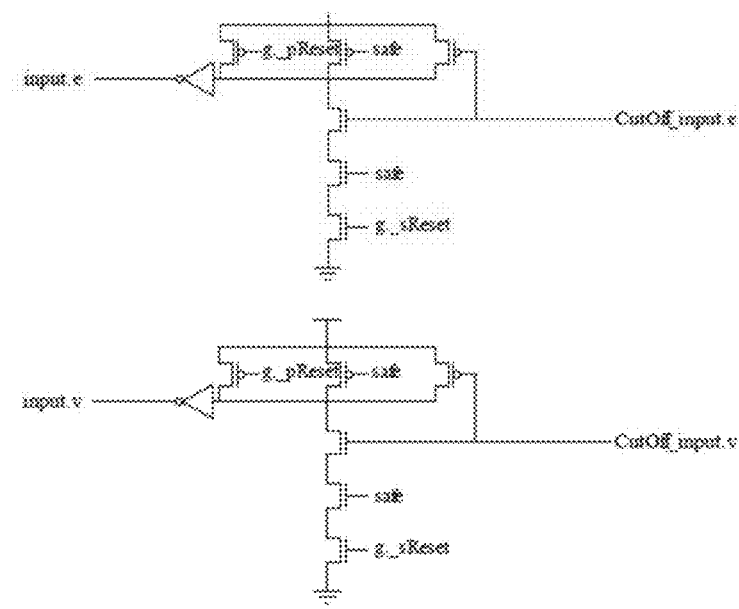
Figure 8C:
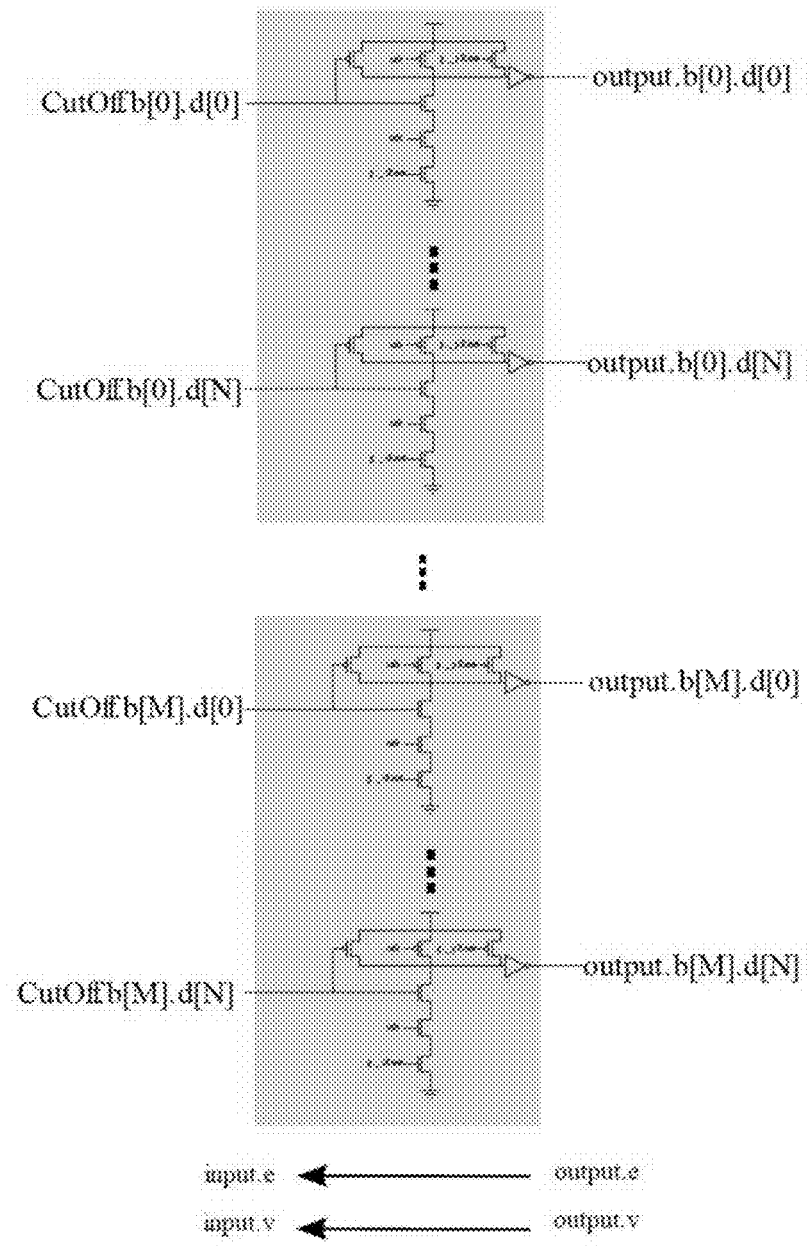

Embodiments of the isolation circuits of these teachings are shown in FIGS. 8a-8c. FIG. 8a shows the data rails and a "safe" signal, which is raised when a pipeline stage has safely powered on, as inputs to a logical AND circuit 98. The circuit of FIG. 8a isolate stages on the output side of the AND from any undesirable signals on the input side of the AND.

FIG. 8b shows detailed schematics of circuits receiving driving input.e and input.v and is essentially the same AND structure between the control signals and the "safe" signal, with the addition of pReset and sReset signals to ensure that during reset the gate has the correct state.

FIG. 8c shows a similar circuit having the data rails as inputs.

State Preserving

The state preserving power-gating scheme of these teachings improves upon the Zig-Zag Cut Off (ZZCO) power gating scheme shown in M. Imai, et al. "Fine-grain leakage power reduction method for m-out of-n encoded circuits using multi-threshold-voltage transistors." *IEEE ASYNC*, pp. 209-216, 2009, which is incorporated by reference herein in its entirety for all purposes, which offers a good tradeoff between power savings and performance degradation for this class of power gating. In idle mode, there are no inputs and all logic blocks have finished computation. Therefore, each individual logic block is waiting for data. By analyzing the handshaking expansions of each process, we can ascertain the value of most signals in the idle state. One exception involves the case of two-phase handshakes where the number of handshakes is not guaranteed to be even. Nevertheless, for most cases, Zig-Zag power gating by connecting all the logic blocks whose output is logic 1 to gvssv and all the nodes whose output is logic 0 to gvddv can be used.

In order to efficiently power gate pseudo-static operators, we gate the forward inverter of the staticizer in addition to the logic stacks depending on the idle state output of the logic. Essentially, pseudo-static Zig-Zag Cut-Off (ZZCO) power gating adds sleep transistors to the logic stack and the feedback transistors of pseudo-static operator shown in FIG. 4b.

FIGS. 6a, 6b show Zig-Zag Power Gating with Weakened Staticizers (ZZCO-WS) using (a) Virtual Power Rails or (b) Sleep Signals. The leakage through the feedback inverter can be reduced by connecting the gates of M3 and M4 to gvddv and gvssv, as shown in FIG. 6a. Alternatively, the gates could be connected to the sleep signal directly, as in FIG. 6b, but the area penalty would be high because the sleep signal would need to be routed to individual staticizers, as opposed to just the shared sleep transistors. The technique of driving the gates of M3 and M4 with gvddv and gvssv is referred to as Zig-Zag Cut Off with Weakened Staticizers (ZZCO-WS).

Note that one difference between ZZCO and ZZCO-WS is between which signals drive the gates of M3 and M4. Thus, the area overhead for implementation of ZZCO-WS versus ZZCO is negligible, as all the supply nets—i.e. gvssv, gvddv, GND, and VDD—are locally accessible to each layout cell.

The ZZCO-WS of these teachings, illustrated in the embodiments shown in FIGS. 6a, 6b, includes a first logic gate 110 and a second logic gate 120 receiving as input an output of the first logic gate 110. The second logic gate including an inverter 130, a first p-channel transistor 140, a gate of the first p-channel transistor being connected to an output of the inverter, a drain of the first p-channel transistor being connected to an input of the inverter, a second p-channel transistor 150, a drain of the second p-channel transistor being connected to the source of the first p-channel transistor, a source of the second p-channel transistor being connected to a power supply connection for that first logic gate, a first n-channel transistor 160, a gate of the first n-channel transistor being connected to the output of the inverter, a drain of the first n-channel transistor being connected to the input of the inverter, and a second n-channel transistor 170, a drain of the second n-channel transistor being connected to a source of the first n-channel transistor, a source of the second n-channel transistor being connected to a ground voltage connection for the first logic gate. The ZZCO-WS of these teachings also includes a gated power supply power net 180 and a gated ground power net 190. The gated power supply power net is inserted between a power supply source and a power supply connection for the first or second logic gate when a logic gate output for the first or second logic gate is low. The gated ground power net is inserted between a ground voltage source and a ground voltage connection for the first or second logic gate when the logic gate output for the first or second logic gate is high. A gate of the second p-channel transistor being connected to a first control signal, and a gate of the second n-channel transistor is connected to a second control signal. In one instance, the first control signal is a virtual ground voltage. In another instance, the second control signal is a virtual power supply voltage.

In one embodiment, the first logic gate 110 includes a pull-up component (PUN) 115 and a pull-down component (PDN) 117, the pull-up component 115 being connected between the power supply connection for the first logic gate and an output of the first logic gate, the pull-down component 117 being connected between an output of the first logic gate and the ground supply connection for the first logic gate.

In addition to power gating logic circuits, power gating can, and has been, extended to register files and SRAM memory cells. Similar to the techniques described earlier, power gating of memory can be non-state and state preserving. However, in contrast to the state preserving techniques described hereinabove, the value of each memory cell is not known at design time, unlike the idle values of a logic circuit. While the Cut-Off non-state preserving power gating technique is applicable to memory for state-destructive power gating, the Zig-Zag Cut-Off power gating technique is not appropriate for memory cells, as the cell values are unknown at design time.

Control Circuitry

The power gating control techniques for wake up and empty pipeline detection of these teachings are shown herein below. These techniques are power gating scheme agnostic and can be used with any of the schemes outlined hereinabove.

Zero-Delay Ripple Turn On

The Zero-Delay Ripple Turn On (ZDRTO) power gating scheme of these teachings allows the wake up latency of downstream pipeline stages to be hidden by the computation latencies of upstream stages, hence wakeup is "zero delay." This sequential or "ripple" turn on also minimizes the voltage fluctuations such as ground bounce that often occur during wake up of power gated circuits.

The Communicating Hardware Process (CHP) process below describes an asynchronous N stage pipelined computation:

$$P \equiv *[L_0?x_0; L_1!f_0(x_0)] \| \ldots \| *[L_n?x_n; L_{n+1}!f_n(x_n)]$$

The program notation used herein as well as terms such as "probe" follow the nomenclature of the modified "guarded command language" described in A. J. Martin, "Compiling communicating processes into delay-insensitive VLSI circuits." *Distributed Computing*, 1(4):226-234, 1986, which is incorporated by reference herein in its entirety for purposes.

Figure 9:
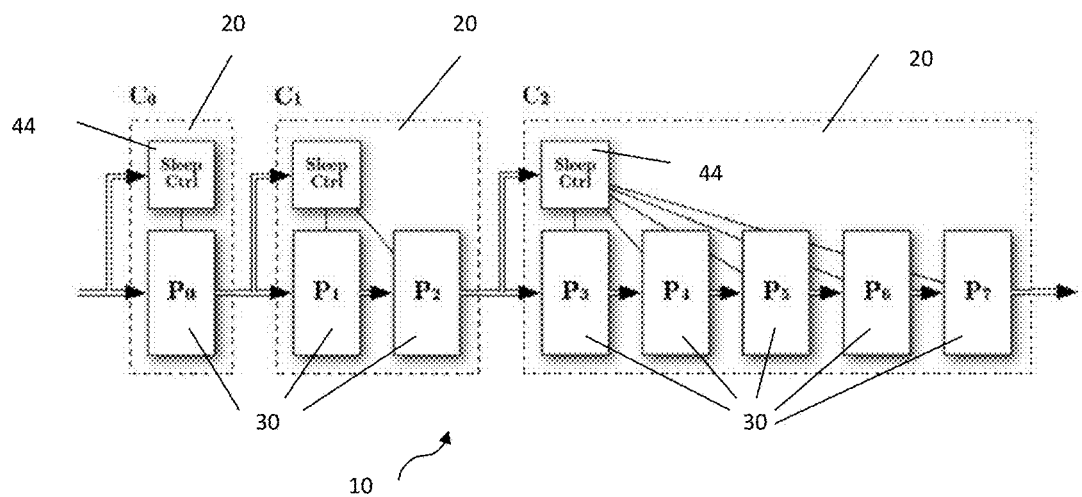
FIG. 9 is a schematic block diagram representation of one embodiment of the device of these teachings.

These pipeline stages are grouped into clusters, each with its own local gvssv or/and gvddv power nets and associated sleep transistors, allowing us to power gate each cluster individually, as shown in FIG. 9.

Referring to FIG. 9, the embodiment of a pipeline 10 shown therein includes a number of groups (clusters) 20 of pipeline stages, each cluster having at least one pipeline stage 30, and a number of control components 44 controlling the gating of power supply or/and ground. Each cluster 20 controlling the gating of power supply or/and ground of a subsequent cluster 20.

The ripple turn on effect occurs upon arrival of an input token to process P. At this time, the first cluster is woken up, which wakes up the second cluster, and so on. This continues as the token travels through the pipeline with cluster i waking up cluster j, until the last cluster is active. Note that i and j do not have to be consecutive clusters—a token arriving at cluster i could potentially wake up the next few clusters.

While the Zero Delay Ripple Turn On method is disclosed in detail hereinbelow, it should be noted that the pipeline can be power gated by the methods for asynchronous power gating disclosed hereinabove and the power gating methods can be applied as a gated power supply net or a gated ground power net or both.

It should also be noted that while the Zero Delay Ripple Turn On method is disclosed in general form, the method can be applied utilizing gated power supply nets or gated ground power nets or both.

In order to achieve the "zero-delay" effect, the cluster grouping should be chosen so that the forward propagation delay, $t_{fp}(i, j)$, from cluster i to j hides the latency, $t_w(j)$, of waking up cluster j, as seen in Eq. 1.

$$t_w(j) \le t_{fp}(i,j) \forall \{i,j | i<j\} \quad (1)$$

Achieving this requirement is not difficult in modern processes, especially for low duty cycle pipelines. Note that the value of $t_w$ is variable, as asynchronous circuits have a wide operating voltage range. Furthermore, by selecting different power gating techniques the value of $t_w$ is coarsely tunable. A conservative choice of $t_w$ such that gvssv and gvddv are equal to GND and VDD, respectively, for any particular cluster by the time the first token arrives—with the exception of the first cluster-ensures each cluster is ready to perform useful computation the moment data arrives. This is the origin of the "zero-delay" latency hiding effect. A more aggressive choice of $t_w$ such that gvssv>GND and gvddv<VDD results in additional power savings at the cost of a longer forward propagation delay of the first tokens for that cluster and a longer pipeline latency overall. Correctness and stability are conserved, so long as gvssv and gvddv have reached safe values when $t_w$ has elapsed.

Figure 16:
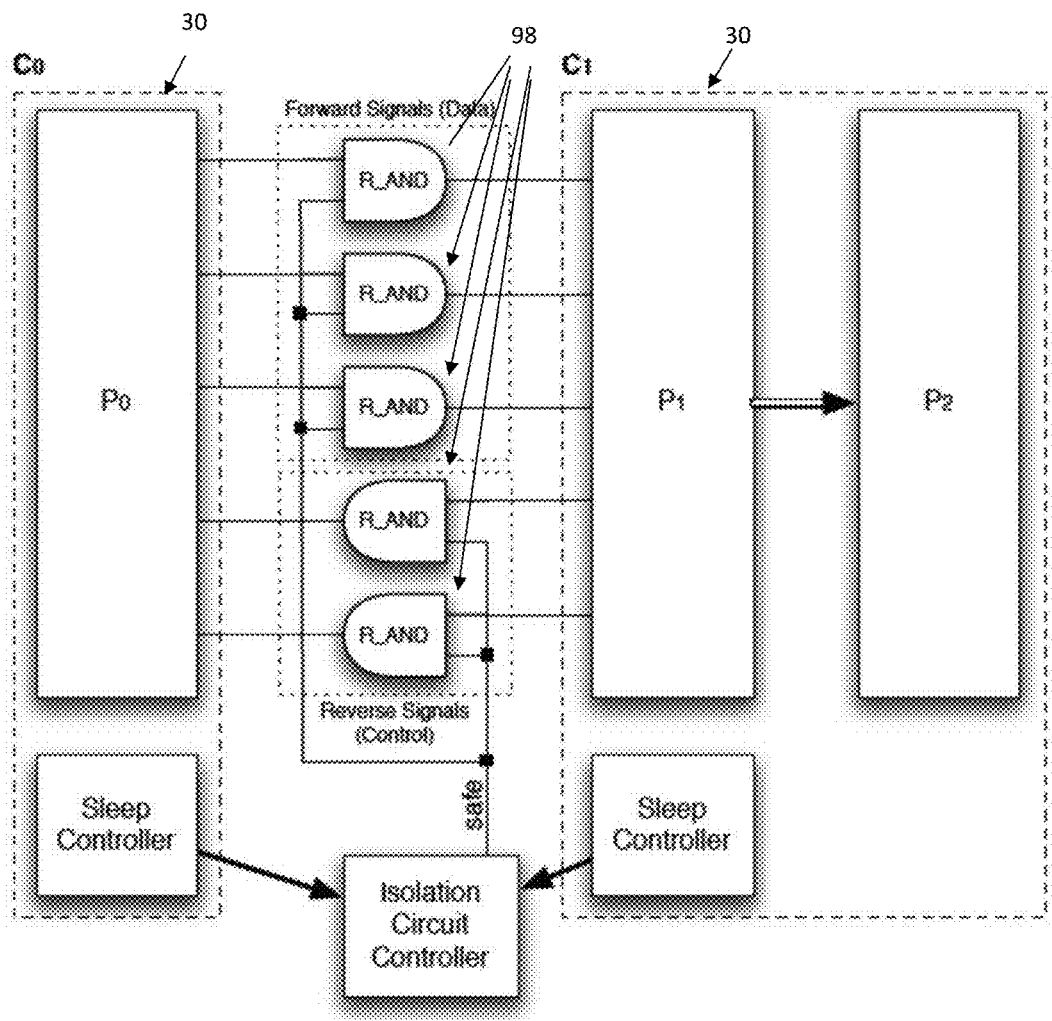
FIG. 16 is a schematic block diagram representation of a further embodiment of the device of these teachings.

FIG. 16 shows isolation circuits 98 in a pipeline, between clusters $C_0$ and $C_1$ 30. Here there are three data signals feeding forward, and two control signals feeding back. The isolation circuits 98 are shown as R_AND gates, or "Resettable AND" gates, but that is not a limitation of these teachings and the isolation circuits 98 could be implemented in various different ways. The sleep controllers of the adjacent clusters control the isolation circuit controller, which passes the "SAFE" signal to the R_AND gates.

Some of the isolation circuits 98 substantially prevent undesired signals from reaching the second cluster $C_1$ from the first cluster $C_0$; others of the input isolation circuits 98 substantially prevent other undesired signals from reaching the first cluster $C_0$ from the second cluster $C_1$. It should be noted that the sleep controller is a component of or interacts with the gated power supply power net or the gated ground power net. It should be noted that the use of isolation circuits is independent of whether or not the Zero Delay Ripple Turn On method is utilized.

It is necessary to substantially prevent undesired signals on the control lines from the gated power supply power net or the gated ground power net from feeding back into stage $C_0$, as shown in FIG. 16. Some of the isolation circuits substantially prevent control signals from flowing back into $C_0$. Others of the isolation circuits substantially prevent signals from traveling from $C_0$ to $C_1$ and corrupting the power-on sequence or operation of $C_1$.

In the case where a memory is to be accessed as part of a pipelined computation or operation, the ZDRTO technique of these teachings can be applied to the memory as well, assuming a state preserving technique has been used for the memory. ZDRTO allows the latency of waking up the memory to be hidden by upstream pipeline stage wakeup and computation latencies. Although we cannot access the memory without it being fully powered on, unlike a gated pipeline stage, we can mitigate the effects of this by careful selection of a pipeline clustering scheme to ensure the latency of memory wakeup is adequately hidden. However, even in pathological cases, the Quasi-Delay Insensitive (QDI) nature of the asynchronous computation methodology of these teachings ensure correctness even in spite of the additional latency.

Empty Pipeline Detection

Hereinabove, waking up power-gated circuits have been discussed, but not the power down sequence. It is of particular importance to determine whether a pipeline is empty before power gating it in order to prevent data loss and incorrect execution. In another instance, the control components controlling the power gating receive a predetermined signal, and power down the gated power nets.

Figure 10:
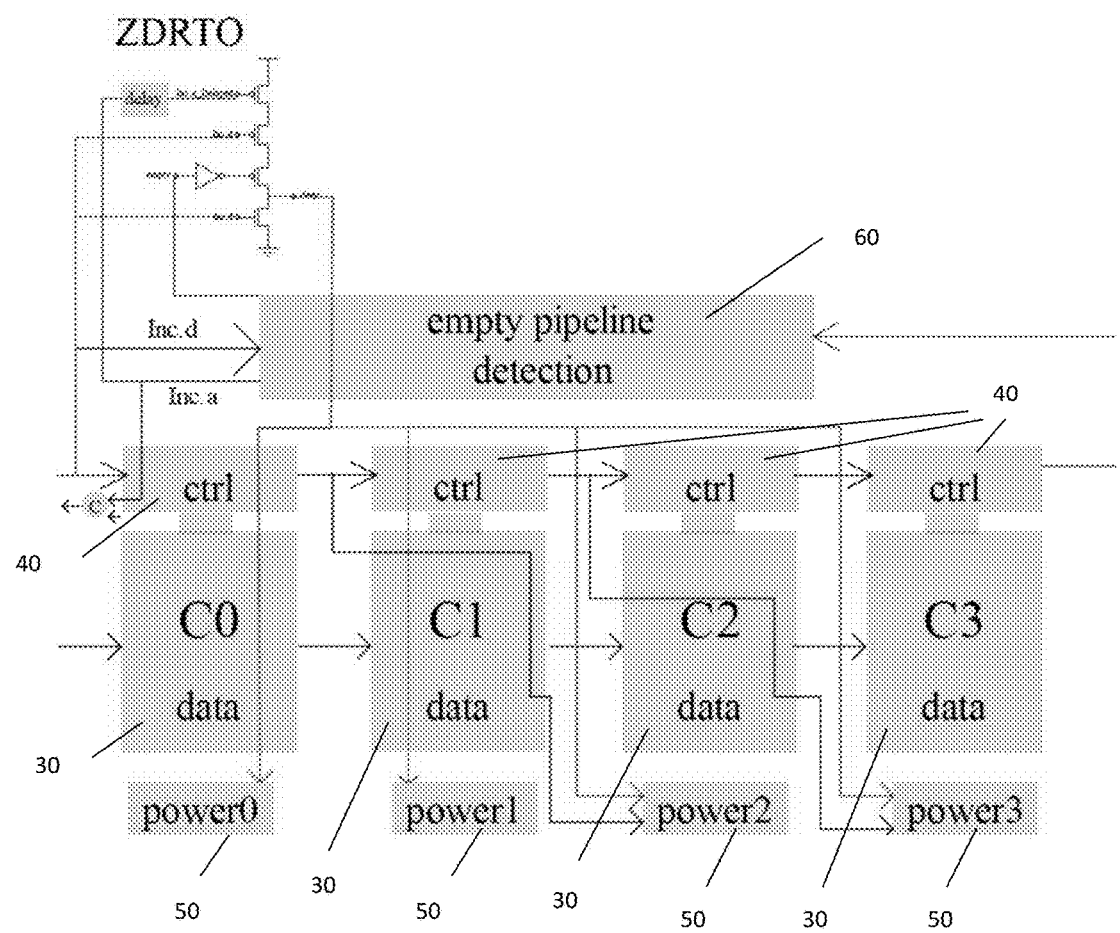
FIG. 10 is a schematic block diagram representation of another embodiment of the device of these teachings.

An embodiment of the pipeline of these teachings including empty pipeline detection is shown in FIG. 10. Referring to FIG. 10, the embodiment shown therein includes a number of clusters 30, each cluster 30 having a gated power supply power net or/and a gated ground power net 50 and a control component 40. The embodiment shown in FIG. 10 also includes an empty pipeline detection component 60. It should be noted that the empty pipeline detection component can be used independent of the gating techniques applied to the gated power supply power net or/and a gated ground power net 50.

There are several methods for empty pipeline detection, which can be loosely classified into one of two categories: methods that instrument each pipeline stage, or those which monitor token flow within a pipeline. The former requires the addition of extra circuitry within each pipeline stage to detect empty status or computation completion. The instrumentation overhead grows linearly with the number of stages, making this method effective only for small pipelines.

Linear-overhead token flow techniques also exist: assuming a FIFO pipeline, inject a flagged NOP token and block further token injection. The exit of the flagged token corresponds to empty pipeline state. However, as with the instrumentation technique, each stage in the datapath must be altered to accept a flagged token.

Another token-flow option is to count incoming and outgoing tokens. While this method does not require instrumentation of individual pipeline stages, it does incur a lg(n) overhead in area, where n is the number of stages, due to the number of bits needed to count tokens. It is essential that the token counting process have a minimal effect on token flow, as any additional latency in token entrance/exit will decrease the throughput of the entire system. Furthermore, the latency of counter operations should be independent of n, especially in the case of aggressively pipelined systems where n is large.

In one embodiment, a pair of rotary counters are utilized, one at the start and one at end of the pipeline to count incoming and outgoing tokens respectively. If the counter values match, the pipeline is empty—i.e. the same number of tokens have entered and left. However, no assumptions can be made about arrival or departure times of tokens in an asynchronous pipeline. As a result, if a token arrives or departs during a counter value comparison, the result of the comparison will be unstable.

A monolithic counter which is capable of servicing increments (token entrance), decrements (token exit), and zero-value (empty pipeline) checks in constant time is disclosed hereinbelow. Zero checks are performed after servicing an increment or decrement, resulting in a stable output. The simultaneous arrival of increment and decrement events effectively cancel one another, so the counter can afford to do nothing, saving power. The pathological case occurs when the arrival of one or another event overlaps with the servicing of a prior event, stalling the new event and token entrance/exit. However, a pipeline operating at full throughput issues consecutive token entrance/exit events. Thus, if an event has been stalled, the next time the counter is available it will see "simultaneous" events—i.e. it will see simultaneous increments and decrements in steady state. If throughput remains an issue and additional overhead is acceptable, interleaving a pair of counters may be appropriate.

Figure 11:
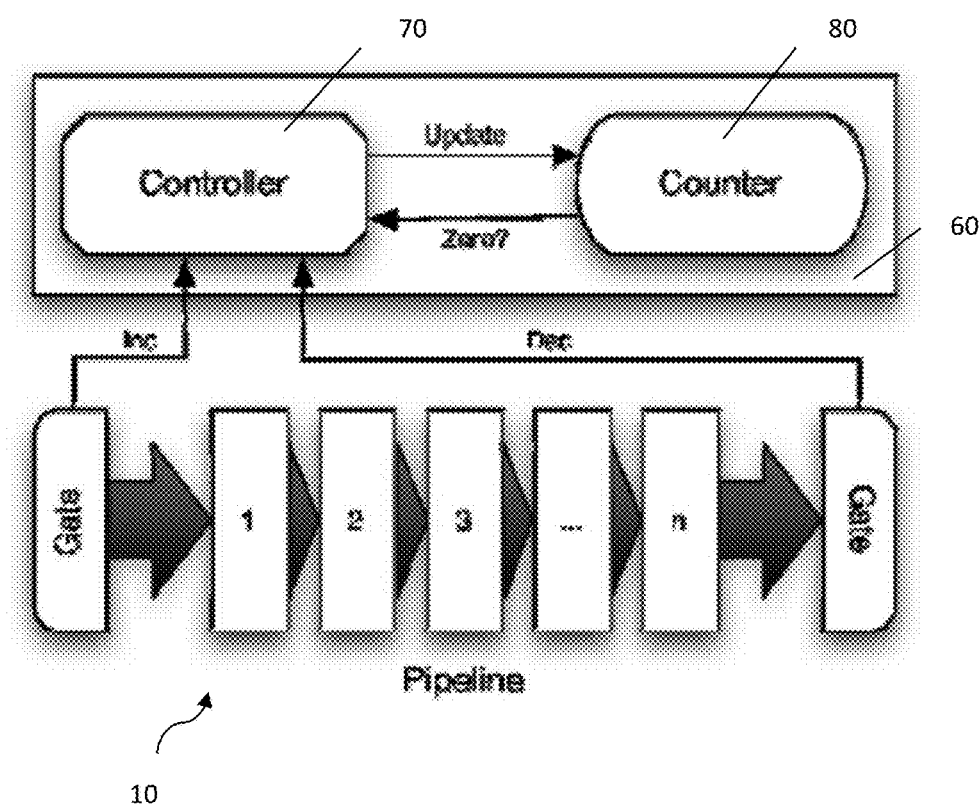
FIG. 11 is a schematic block diagram representation of an embodiment of a component of the device of these teachings.

An embodiment of the pipeline of these teachings including an empty pipeline detection component, where the empty pipeline detection component includes a controller and a counter is shown in FIG. 11. Referring to FIG. 11, the embodiment shown therein includes a pipeline 10 with an empty pipeline detection component 60. The empty pipeline detection component 60 includes a controller 70 and a counter 80.

Since the counter must ensure that increments and decrements occur atomically, the controller 70 in embodiment of FIG. 1 must guarantee that the counter does not receive an increment (decrement) command while a decrement (increment) request is currently being serviced. Additionally, the controller 70 ensures that simultaneous increments and decrement requests, the net effect of which is a no-op, are acknowledged but not acted upon. Note that the controller 70 detects not only the presence of an increment or decrement request, but also the absence of one.

Implementing the controller requires a process to properly implement negated probes, which are inherently unstable—a probe will remain true until it is acknowledged, but a probe that is false may become true at any time. A stable data channel to represent a probe's state and use an observing process to update this data channel can be implemented. This new data channel acts as a proxy for the probe which can be queried for negated probe status without violating stability assumptions. Such a process is shown below:

Negated Probe≡*[[$\overline{A}$→PA!true,A | ¬ $\overline{A}$→PA!false]]

The controller is constructed in the following manner: the increment (Inc) and decrement (Dec) signals each utilize a dedicated negated probe process which monitors the probe state and updates the proxy channels (IncP/DecP) as necessary. Another process waits for the true condition of either the Inc or Dec channel, copies the status of the proxy channels into local variables, and then communicates the appropriate update command to the counter (C_Inc or C_Dec). Note that if both the IncP and DecP channels evaluate to true, a skip command is issued instead of propagating the increment and decrement requests to the counter. The control process is shown herein below, where IncP and DecP are the proxy channels from the negated probe process as described above:

Counter Controller ≡ *[[$\overline{Inc}$ ∨ $\overline{Dec}$]; IncP?x,

DecP?y;[x ∧ y → skip□x ∧ ¬ y → C_Inc□¬ x ∧ y → C_Dec]]

Constant-Time Counter Design

Figure 12:
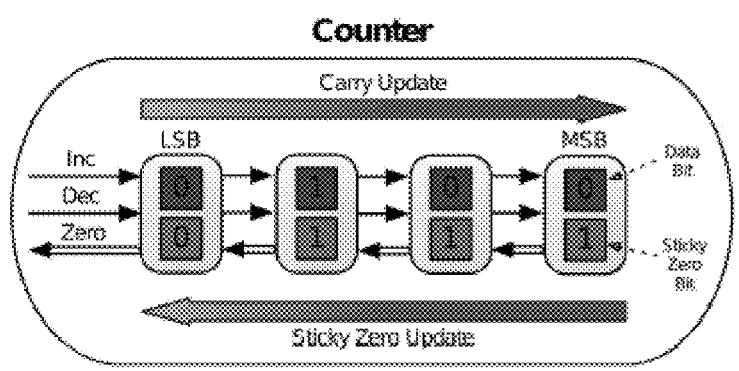
FIG. 12 is a schematic block diagram representation of an embodiment of another component of the device of these teachings.
Figure 13:
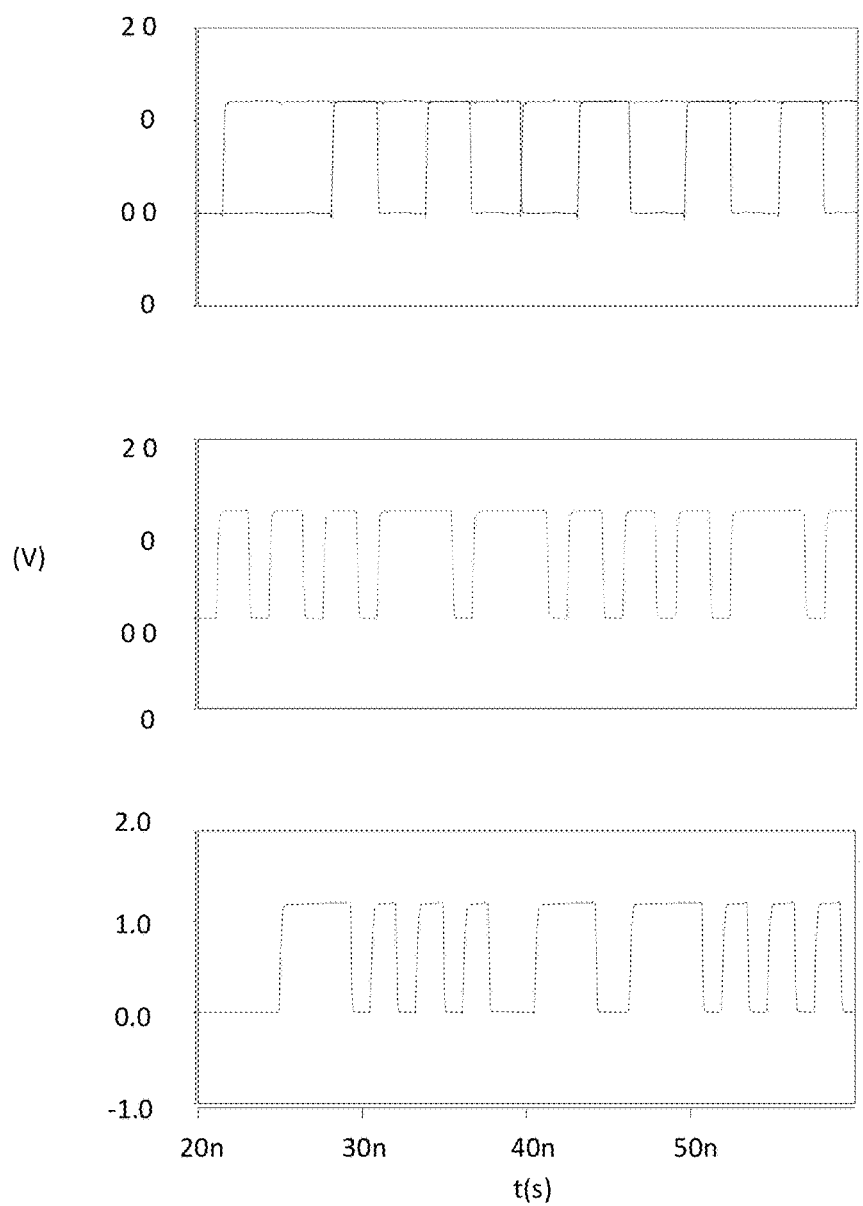
FIG. 13 is a graphical pictorial representation of signals in an embodiment of the components of the device of these teachings.

The counter is designed to provide constant-time increment and decrement operations, as well as low overhead updates of zero status. In one embodiment, the basic design element is a single-bit counter, several of which are connected together to create a counter with multi-bit capacity as seen in FIG. 12. Each single-bit counter accepts an increment or decrement signal and, in the event of a carry operation, sends an increment or decrement signal to the next counter. Additionally, each single-bit counter maintains a local copy of the bit it represents.

The counter of FIG. 12 uses a sticky zero bit to provide a low-overhead determination of zero status. The sticky-zero bit of each single-bit counter represents whether or not all counters above it—those closer to the MSB—are zero. By inspecting the data and sticky-zero bits of the LSB counter, we can determine if the entire multi-bit counter is empty. Each single bit counter has a channel to read the sticky-zero status of higher bits (Zero U) and a channel to communicate sticky-zero status (Zero) to lower bits.

The single-bit counter process operates by waiting on a communication action on either its increment (C_Inc) or decrement (C_Dec) channel, both of which are dataless. An increment action always results in the transmission of a false value on the one-bit Zero channel, since an increment action always implies that the multibit counter is non-zero. A decrement action transmits the AND of the sticky-zero bit (sz) and the local bit value (x) on the Zero channel. Transmission of the zero value on the Zero channel is always the first communication handshake to complete in order to ensure that multibit counter updates remain constant time regardless of the number of bits. Note that increment and decrement actions will result in a x:=~x transition, and that the communication on Zero occurs before the x:=~x transition This ensures the transmission of sz AND x is correct, as x will eventually be ~x at the end of the execution of the process.

After the Zero channel handshake is complete, the single-bit counter process then proceeds with completing the increment or decrement handshake, the carry channel communication, and the local bit value update, all of which may happen in parallel. The carry channel communication (C_IncU/C_DecU) only occurs when a carry operation is necessary, otherwise a skip is executed. A separate process, pulled out during process decomposition, is used to update the status of the sticky-zero bit. The CHP for a single-bit counter is shown below:

Single Bit Counter ≡ *[[$\overline{Inc}$ → Zero!false;

Inc, [x → IncU□¬ x → IncF], x := ¬ x□$\overline{Dec}$ → Zero!(sz ∧ x);

Dec, [x → DecF□¬ x → DecU], x := ¬ x]]| * [ZeroU?sz]

For the above embodiment, counter latency can have an effect on throughput. FIG. 3 shows Stretched increment and decrement handshakes of the above embodiment of a counter. The middle trace is the probe of the increment channel, and the bottom trace is that of the decrement channel. The topmost trace represents the local variables x and y within the counter controller. Note the ideal case is for both x and y to be simultaneously true. While this does occur, it does not occur in steady state. Also note the clear stretching of the channel probes, indicating exclusive, atomic servicing of either an increment or decrement event.

Another embodiment of the counter of these teachings is an interleaved counter. The empty pipeline detection component of these teachings utilizing an interleaved counter, shown in FIG. 14, uses two deterministic splits, one for Inc and one for Dec, and two complete counter structures. One counter keeps track of odd tokens, and the other even. The new empty pipeline test is the AND of the empty test from each counter.

Figure 14:
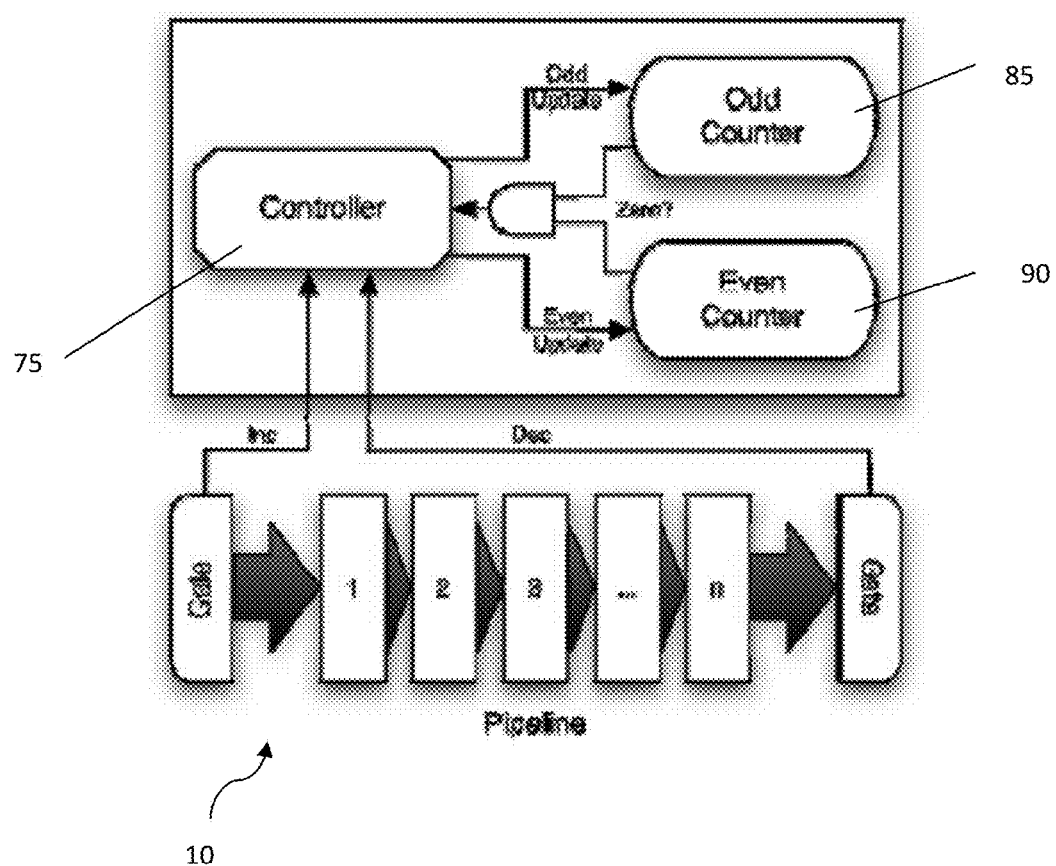
FIG. 14 is a schematic block diagram representation of another embodiment of a component of the device of these teachings.

Referring to FIG. 14, the embodiment shown therein includes a pipeline 10 having a number of groups of pipeline stages (clusters), a controller 75 receiving a decrement signal when a token exits from an exit group of pipeline stages and an increment signal when a token enters a first group of pipeline stages and a pair of counters 85, 90. A first counter 85 from the pair receiving signals for odd numbered tokens and a second counter 90 from the pair receiving signals for even numbered tokens, the signals being increment signals and decrement signals. Each one of the first and second counters 85, 90 produces a zero value when a count of the decrement signals equals a count of increment signals. A value representing an empty state of the pipeline can be obtained from a logical AND operation receiving as input the zero value from the first counter 85 and the zero value from the second counter 90. (An "exit group of pipeline stages," as used herein, is a group of pipeline stages from which a token exits the pipeline.)

Adding an alternating split processes on the increment and decrement channels allows one counter to observe odd tokens and the other even tokens.

The interleaved counter system of these teachings for empty pipeline detection in single-input, single-output pipelines was implemented and is disclosed herein below. Each counter is constructed of an array of single-bit counters, each of which maintains its own value as well as an additional sticky-zero bit. The sticky-zero bit is true if all of the more significant counter bits are 0, and false if any of the more significant bits are 1. If a carry operation occurs during the update of a particular single-bit counter, it will send an increment or decrement command to the next higher-order counter and receive an update to its local sticky-zero bit from the higher-order counter. Thus, the zero-state of the entire counter array can be determined in constant time by examining only the value and sticky zero bit of the least significant single-bit counter.

Figure 15:
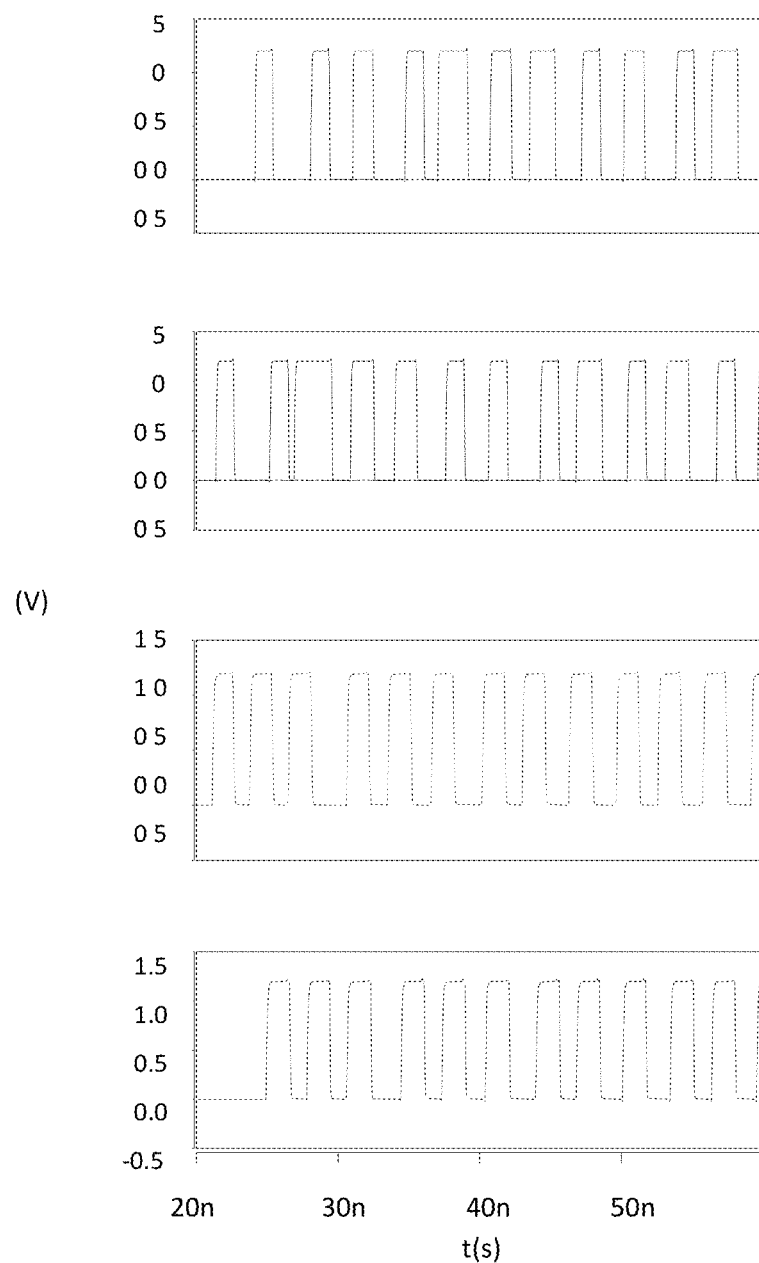
FIG. 15 is a graphical pictorial representation of signals in another embodiment of the components of the device of these teachings.

FIG. 15 shows interleave increment and decrement handshakes. The bottom two traces are the probes of increment and decrement, respectively. The top two traces show the interleaving behavior of increments and decrements for the odd and even counters, respectively. Increment and decrement events arriving at each counter controller are almost always perfectly interleaved, as seen in FIG. 15, all but eliminating the occurrence of simultaneous request arrivals resulting in no-ops. A positive consequence of an interleaved design is that it permits a reduction in the number of bits needed by each counter structure.

Simulation results are presented in order to illustrate the application of these teachings. It should be noted that, although a specific device is simulated, these teachings are not limited only to that device or to that type of device. All simulation results presented herein below use the BSIM4 device model, which explicitly accounts for gate, substrate and reverse biased junction leakage. The power gating techniques of these teachings were applied to a FIPS-compliant, 128-bit Advanced Encryption Standard (AES) encryption/decryption engine. The AES engine was chosen because of its complexity, wide datapath, and low duty cycle-encryption engines are usually inactive for long periods of time. The AES round operation, which consists of four operations, was examined and the results are provided in Table I. Note that the BS operation is implemented with the sbox design presented in J. Wolkerstorfer, et al. "An asic implementation of the aes sboxes." "CT-RSA: Cryptographer's Track at the RSA Conference on Topics in Cryptology," pp. 67-78. Springer-Verlag, 2002

TABLE I

AES ROUND OPERATIONS

|  | Transistors |
|---|---|
| Add Round Key (AK) | 8400 |
| Byte Substitute (BS) | 84144 |
| Shift Rows (SR) | 7567 |
| Mix Column (MC) | 30000 |
| Control Circuitry | 18000 |
| Total | 148111 |

As disclosed hereinabove, to implement the Zero-Delay Ripple Turn On (ZDRTO) power gating control scheme of these teachings, the pipeline stages have to be organized into clusters. In the exemplary embodiment used in the simulation disclosed above, the clusters are simply the different operations of the AES round computation described hearing above, each of which is a pipelined computation. BS and SR are transformations on individual bytes, by slicing the datapath in 8-bit chunks, their ordering could be swapped with no effect on correctness. The ordering is swapped because the BS operation has a higher transistor count, as seen in Table I, and thus takes a longer time to wake up. Furthermore, reordering the BS and SR stages also allows for hardware reuse between encryption and decryption. The final pipeline stage clustering is as follows: AK, SR, BS, MC.

Although the present teachings are not limited to the exemplary embodiment, AES, the exemplary embodiment illustrates the benefits of asynchronous pipelining and of the ZDRTO technique of these teachings.

Figure 17:
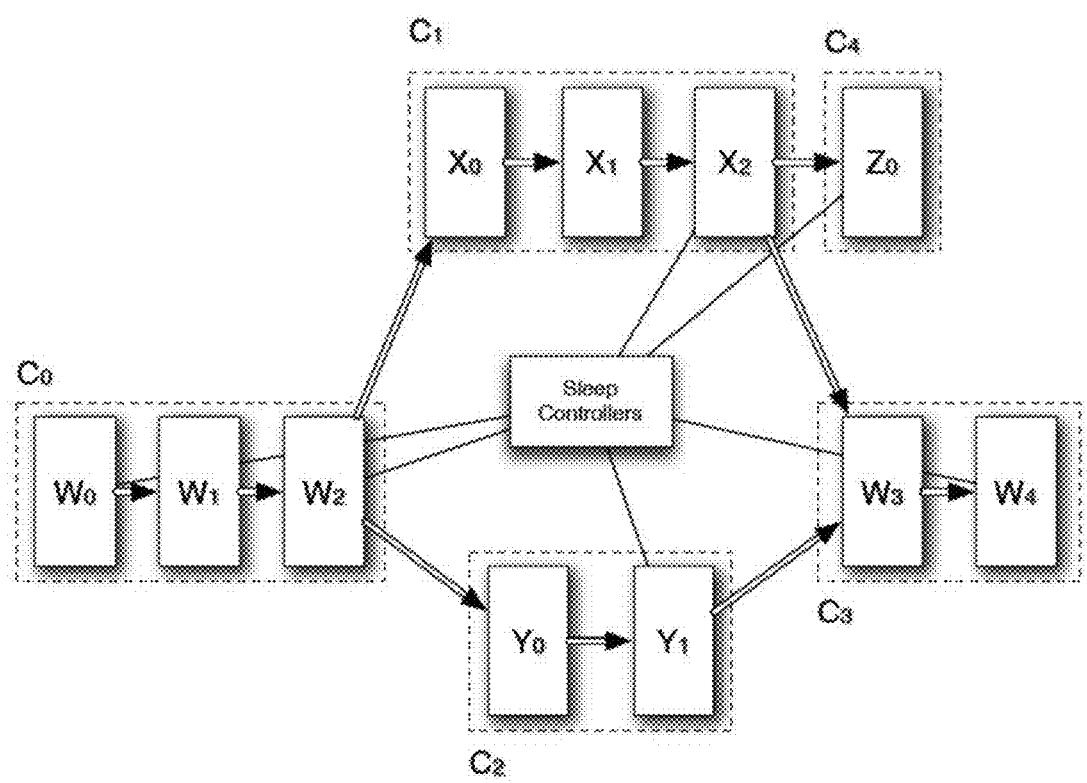
FIG. 17 is a schematic block diagram representation of yet another embodiment of the device of these teachings.

Although the embodiments shown hereinabove are shown in reference to a straight-line pipeline, it should be noted that these teachings are not limited only to a straight-line pipeline. For example, also not a limitation of these teachings, the pipeline shown in FIG. 17 exhibits one divergence, from $C_0$ to $C_1$ and $C_2$, and one convergence, from $C_1$ and $C_2$ to $C_3$ (divergences and convergences are sometimes referred to as "forks" and "joins" respectively). In the embodiment shown in FIG. 16 there are two exit cluster $C_3$ and $C_4$, clusters from which tokens exit the pipeline.

It should be noted that, in the ZDRTO method of these teachings, the gated power supply power net and the gated ground power net can be implemented utilizing any power gating method including, but not limited to, the power dating methods described hereinabove.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although the invention has been described with respect to various embodiments, it should be realized these teachings are also capable of a wide variety of further and other embodiments within the spirit and scope of the appended claims.

What is claimed is:

1. A device comprising:
   a pipeline comprising:
      two or more groups of pipeline stages, each group comprising at least one pipeline stage;
      at least two groups comprising a gated power supply power net; said gated power supply power net having components that allow gating power supply to said at least one group; and
      one or more control components; each control component from said one or more control components controlling the gating of power supply;
   at least one group of pipeline stages controlling the gating of power supply of at least one subsequent group of pipeline stages;
   each one group of pipeline stages being such that a largest forward propagation delay from at least one preceding group of pipeline stages to said each one group is at least equal to a time required for activating gated power supply in said each one group; wherein upon turning on power supply of one group, power supply of a subsequent group is turned on; wherein each stage from said each group is an asynchronous stage; and wherein said one group and said subsequent group are not merged.

2. The device of claim 1 wherein virtual power supply voltage is substantially equal to an ungated power supply voltage.

3. The device of claim 1 wherein virtual power supply voltage is less than an ungated power supply voltage.

4. The device of claim 1 further comprising an empty pipeline detection component.

5. The device of claim 4 wherein said empty pipeline detection component receives a control signal from one or more exit groups of pipeline stages and generates a power gating signal.

6. The device of claim 5 wherein said empty pipeline detection component comprises a controller receiving a decrement signal when a token exits from said one or more exit groups of pipeline stages and an increment signal when a token enters a first group of pipeline stages; and a counter receiving signals from said controller; the signals comprising increment signals and decrement signals; said counter producing a zero value representing an empty state of the pipeline; said controller ensuring that said counter does not receive one increment/decrement signal while one decrement/increment signal is being processed; and ensuring that substantially simultaneous increment and decrement signals are acknowledged but not counted.

7. The device of claim 5 wherein said empty pipeline detection component comprises a controller receiving a decrement signal when a token exits from said one or more exit groups of pipeline stages and an increment signal when a token enters a first group of pipeline stages; a pair of counters; a first counter from said pair receiving signals for odd numbered tokens; and a second counter from said pair receiving signals for even numbered tokens; the signals comprising increment signals and decrement signals; each one of said first and second counters producing a zero value when a count of the decrement signals equals a count of increment signals; a value representing an empty state of the pipeline be obtained from a logical AND operation receiving as input the zero value from said first counter and the zero value from said second counter; said controller ensuring that said first counter or said second counter do not receive one increment/decrement signal while one decrement/increment signal is being processed; and ensuring that substantially simultaneous increment and decrement signals are acknowledged but not counted.

8. The device of claim 4 wherein said empty pipeline detection component comprises a pair of rotary counters.

9. The device of claim 8 wherein a first rotary counter from the pair counts tokens coming into the pipeline; a second rotary counter from the pair counts tokens exiting the pipeline.

10. The device of claim 1 wherein said one or more control components receive a command to power down gated power supply power nets.

11. The device of claim 1 wherein a group of pipeline stages comprises memory components; and wherein said gated power supply power net and said gated ground power net are gated by state preserving gating techniques.

12. The device of claim 1 wherein input isolation circuits are located between a first group of pipeline stages and a second group of pipeline stages; some of said input isolation circuits substantially preventing undesired signals from reaching said second group from said first group; others of said input isolation circuits substantially preventing other undesired signals from reaching said first group from said second group.

13. The device of claim 1 wherein said at least one group also comprises a gated ground power net; said gated ground power net having components that allow gating ground to said at least one group; and wherein said each one group of pipeline stages being such that a largest forward propagation delay from at least one preceding group of pipeline stages to said each one group is at least equal to a time required for activating gated power supply and ground in said each one group.

14. The device of claim 13 wherein virtual power supply voltage is substantially equal to an ungated power supply voltage and wherein virtual ground voltage is substantially equal to ungated ground voltage.

15. The device of claim 13 wherein virtual power supply voltage is less than an ungated power supply voltage and wherein virtual ground voltage is greater than ungated ground voltage.

16. A method for gating power supply and ground in groups of pipeline stages, the method comprising the steps of:
dividing a pipeline into two or more groups of pipeline stages, each group of pipeline stages comprising at least one pipeline stage; wherein each from the at least two groups also comprises:
a gated power supply power net; said gated power supply power net having components that allow gating power supply to said at least one group;
selecting each one group of pipeline stages such that a largest forward propagation delay from at least one preceding group of pipeline stages to said one group is at least equal to a time required for activating gated power supply in said each one group; wherein upon turning on power supply of one group, power supply of a subsequent group is turned on; and
controlling, for groups other than a first group, the gating of power supply of said one group of pipeline stages by signals received than another preceding group of pipeline stages; wherein each stage from said each group is an asynchronous stage; and wherein said one group and said subsequent group are not merged.

17. The method of claim 16 wherein the step of selecting each one group comprises the step of selecting the time required for activating gated power supply and ground in said one group such that virtual power supply voltage is substantially equal to an ungated power supply voltage.

18. The method of claim 16 wherein the step of selecting each one group comprises the step of selecting the time required for activating gated power supply and ground in said one group such that virtual power supply voltage is less than an ungated power supply voltage.

19. The method of claim 16 further comprising the steps of:
determining whether the pipeline is empty;
providing, if the pipeline was determined to be empty, a signal controlling the activation of gated power supply.

20. The method of claim 19 wherein the step of determining whether the pipeline is empty comprises the steps of:
counting tokens coming into a first stage of the pipeline;
counting tokens exiting a last stage of the pipeline; and
comparing a count of tokens coming into the first stage to a count of tokens exiting the last stage.

21. The method of claim 19 wherein the step of determining whether the pipeline is empty comprises the steps of:
receiving, at a controller, an increment signal for tokens coming into a first stage of the pipeline;
receiving, at a controller, a decrement signal for tokens exiting a last stage of the pipeline;
providing, from the controller to a counter, received signals; the received signals comprising the increment signals and the decrement signals;
obtaining, from the counter, a zero value when a count indicates an empty state of the pipeline.

22. The method of claim 21 wherein the step of determining whether the pipeline is empty further comprises the steps of:
ensuring that the counter does not receive one increment/decrement signal while one decrement/increment signal is being processed; and
ensuring that substantially simultaneous increment and decrement signals are acknowledged but not counted.

23. The method of claim 19 wherein the step of determining whether the pipeline is empty comprises the steps of:
receiving, at a controller, an increment signal for tokens coming into a first stage of the pipeline;
receiving, at a controller, a decrement signal for tokens exiting a last stage of the pipeline;
providing, from the controller to a first counter, received signals corresponding to odd numbered tokens;
providing, from the controller to a second counter, received signals corresponding to even numbered tokens; each one of the first and second counters producing a zero value when a count of the decrement signals equals a count of increment signals;
obtaining a value representing an empty state of the pipeline from a logical AND operation receiving as input the zero value from the first counter and the zero value from the second counter.

24. The method of claim 23 wherein the step of determining whether the pipeline is empty further comprises the steps of:
ensuring that the counter does not receive one increment/decrement signal while one decrement/increment signal is being processed; and
ensuring that substantially simultaneous increment and decrement signals are acknowledged but not counted.

25. The method of claim 16 wherein said at least one group also comprises a gated ground power net; said gated ground power net having components that allow gating ground to said at least one group; wherein the step of selecting each one group of pipeline stages further comprises selecting each one group of pipeline stages such that a largest forward propagation delay from at least one preceding group of pipeline stages to said one group is at least equal to a time required for activating gated power supply and ground in said each one group; and wherein the step of controlling, for groups other than a first group, comprises controlling, for groups other than a first group, the gating of power supply and ground of said one group of pipeline stages by signals received from another preceding group of pipeline stages.

26. A circuit comprising:
a first logic gate;
a second logic gate receiving as input an output of said first logic gate; said second logic gate comprising:
an inverter;
a first p-channel transistor; a gate of said first p-channel transistor being connected to an output of said inverter; a drain of said first p-channel transistor being connected to an input of said inverter;
at least one second p-channel transistor; a drain of said at least one second p-channel transistor being connected to the source of said first p-channel transistor; a source of said at least one second p-channel transistor being connected to a power supply connection for that first logic gate;
a first n-channel transistor; a gate of said first n-channel transistor being connected to the output of said inverter; a drain of said first n-channel transistor being connected to the input of said inverter; and
at least one second n-channel transistor; a drain of said at least one second n-channel transistor being connected to a source of said first n-channel transistor; a source of said at least one second n-channel transistor being connected to a ground voltage connection for said first logic gate;
a gated power supply power net; and
a gated ground power net;
said gated power supply power net being inserted between a power supply source and a power supply connection for the first or second logic gate when a logic gate output for the first or second logic gate is low;
said gated ground power net being inserted between a ground voltage source and a ground voltage connection for the first or second logic gate when the logic gate output for the first or second logic gate is high;
a gate of said at least one second p-channel transistor being connected to a first control signal; and
a gate of said at least one second n-channel transistor being connected to a second control signal.

27. The circuit of claim 26 wherein said first logic gate comprises a pull-up component and a pull-down component; said pull-up component being connected between the power supply connection for said first logic gate and an output of said first logic gate; said pull-down component being connected between an output of said first logic gate and the ground supply connection for said first logic gate.

28. The circuit of claim 26 wherein said first control signal is a virtual ground voltage.

29. The circuit of claim 26 wherein said second control signal is a virtual power supply voltage.

30. A device comprising:
a pipeline comprising:
two or more groups of pipeline stages, each group comprising at least one pipeline stage;
at least two groups comprising a gated ground power net; said gated ground power net having components that allow gating ground to said at least one group;
one or more control components; each control component from said number of control components controlling the gating of ground;
at least one group of pipeline stages controlling the gating of ground of at least one subsequent group of pipeline stages;
each one group of pipeline stages being such that a largest forward propagation delay from at least one preceding group of pipeline stages to said each one group is at least equal to a time required for activating gated ground in said one group; wherein upon turning on power supply of one group, power supply of a subsequent group is turned on; wherein each stage from said each group is an asynchronous stage; and wherein said one group and said subsequent group are not merged.

31. The device of claim 30 wherein the virtual ground voltage is substantially equal to ungated ground voltage.

32. The device of claim 30 wherein virtual ground voltage is greater than ungated ground voltage.

33. The device of chain 30 further comprising an empty pipeline detection component.

34. A method for gating ground in groups of pipeline stages, the method comprising the steps of:
dividing a pipeline into two or more groups of pipeline stages, each group of pipeline stages comprising at least one pipeline stage; at least two groups also comprising a gated ground power net; said gated ground power net having components that allow gating ground to said at least one group;
selecting each one group of pipeline stages such that a largest forward propagation delay from at least one preceding group of pipeline stages to said: one group is at least equal to a time required for activating gated ground in said each one group; wherein upon turning on power supply of one group, power supply of a subsequent group is turned on; and controlling, for groups other than a first group, the gating of ground of said one group of pipeline stages by signals received from another preceding group of pipeline stages; wherein each stage from said each group is an asynchronous stage; and wherein said one group and said subsequent group are not merged.

35. The method of claim 34 wherein the step of selecting each one group comprises the step of selecting the time required for activating gated ground in said one group such that virtual ground voltage is substantially equal to ungated ground voltage.

36. The method of claim 34 wherein the step of selecting each one group comprises the step of selecting the time required for activating gated ground in said one group such that virtual ground voltage is greater than an ungated ground voltage.

37. The method of claim 34 further comprising the steps of:
  determining whether the pipeline is empty;
  providing, if the pipeline was determined to be empty, a signal controlling the activation of ground.

38. An asynchronous device comprising:
  a pipeline comprising:
    one or more groups of asynchronous pipeline stages, each group comprising at least one asynchronous pipeline stage;
    at least one group comprising a gated power supply power net; said gated power supply power net having components that allow gating power supply to said at least one group; and
    a number of control components; each control component from said number of control components controlling gating of power supply;
    wherein said at least one group also comprises a gated ground power net; said gated ground power net having components that allow gating ground to said at least one group; and wherein said each control component also controls gating of ground;
    wherein at least one asynchronous pipeline stage in said at least one group comprises:
      a first logic gate;
      a second logic gate receiving as input an output of said first logic gate; said second logic gate comprising:
        an inverter;
        a first p-channel transistor; a gate of said first p-channel transistor being connected to an output of said inverter; a drain of said first p-channel transistor being connected to an input of said inverter;
        at least one second p-channel transistor; a drain of said at least one second p-channel transistor being connected to the source of said first p-channel transistor; a source of said at least one second p-channel transistor being connected to a power supply connection for that first logic gate;
        a first n-channel transistor; a gate of said first n-channel transistor being connected to the output of said inverter; a drain of said first n-channel transistor being connected to the input of said inverter; and
        at least one second n-channel transistor; a drain of said at least one second n-channel transistor being connected to a source of said first n-channel transistor; a source of said at least one second n-channel transistor being connected to a ground voltage connection for said first logic gate;
      said gated power supply power net being inserted between a power supply source and a power supply connection for the first or second logic gate when a logic gate output for the first or second logic gate is low;
      said gated ground power net being inserted between a ground voltage source and a ground voltage connection for the first or second logic gate when the logic gate output for the first or second logic gate is high;
      a gate of said at least one second p-channel transistor being connected to a first control signal; and
      a gate of said at least one second n-channel transistor being connected to a second control signal.

39. The asynchronous device of claim 38 wherein said first logic gate comprises a pull-up component and a pull-down component; said pull-up component being connected between the power supply connection for said first logic gate and an output of said first logic gate; said pull-down component being connected between an output of said first logic gate and the ground voltage connection for said first logic gate.

40. The asynchronous device of claim 38 wherein said first control signal is a virtual ground voltage.

41. The asynchronous device circuit of claim 38 wherein said second control signal is a virtual power supply voltage.

* * * * *